(12) United States Patent
Kim et al.

(10) Patent No.: US 11,887,765 B2
(45) Date of Patent: Jan. 30, 2024

(54) SWITCHING TRANSFORMERS AND ELECTRONIC DEVICES INCLUDING THE SAME

(71) Applicant: SAMSUNG ELECTRONICS CO., LTD., Suwon-si (KR)

(72) Inventors: Youngmin Kim, Suwon-si (KR); Sunwoo Lee, Suncheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 774 days.

(21) Appl. No.: 16/736,928

(22) Filed: Jan. 8, 2020

(65) Prior Publication Data

US 2020/0395158 A1 Dec. 17, 2020

(30) Foreign Application Priority Data

Jun. 11, 2019 (KR) .......... 10-2019-0068806

(51) Int. Cl.
*H01F 21/12* (2006.01)
*H03H 7/42* (2006.01)
*H01F 19/04* (2006.01)
*H01F 17/00* (2006.01)

(52) U.S. Cl.
CPC ......... *H01F 21/12* (2013.01); *H01F 17/0006* (2013.01); *H01F 19/04* (2013.01); *H03H 7/42* (2013.01)

(58) Field of Classification Search
CPC ........... H03H 7/42; H01F 19/06; H01F 19/04; H01F 2017/006; H01F 17/0006; H01F 21/12
See application file for complete search history.

(56) References Cited

U.S. PATENT DOCUMENTS

| 7,372,352 | B2 | 5/2008 | Lee et al. |
| 8,054,153 | B2 | 11/2011 | Jeon et al. |
| 9,608,574 | B2 | 3/2017 | Choksi et al. |
| 2004/0036534 | A1* | 2/2004 | Gupta ............... H03F 1/52 330/260 |
| 2010/0076475 | A1* | 3/2010 | Yates ............ A61B 17/07207 606/170 |
| 2010/0123536 | A1 | 5/2010 | Lu et al. |
| 2018/0115198 | A1 | 4/2018 | Chen et al. |
| 2019/0058445 | A1 | 2/2019 | Anderson et al. |
| 2019/0109612 | A1* | 4/2019 | Robert ............... H01F 17/00 |
| 2020/0343614 | A1* | 10/2020 | Chakraborty ...... H03H 5/003 |
| 2021/0119596 | A1* | 4/2021 | Yu ................... H03H 7/1775 |

FOREIGN PATENT DOCUMENTS

| KR | 10-0793149 | 1/2008 |
| KR | 10-1266955 | 5/2013 |
| KR | 10-1635146 | 6/2016 |

* cited by examiner

*Primary Examiner* — Patrick C Chen
(74) *Attorney, Agent, or Firm* — F. CHAU & ASSOCIATES, LLC

(57) ABSTRACT

A switching transformer includes a primary circuit and a secondary circuit. The primary circuit includes a first input/output (I/O) terminal, a plurality of primary windings, and primary switching circuitry including at least one switch configured to selectively connect the plurality of primary windings in series or in parallel. The secondary circuit includes a second I/O terminal, a plurality of secondary windings, and secondary switching circuitry including at least one switch configured to selectively connect the plurality of secondary windings in series or in parallel.

15 Claims, 18 Drawing Sheets

LP1

VDD

LP2

ST

SWITCHING TRANSFORMERS AND ELECTRONIC DEVICES INCLUDING THE SAME

CROSS-REFERENCE TO RELATED APPLICATION

This application claims the benefit of Korean Patent Application No. 10-2019-0068806, filed on Jun. 11, 2019, in the Korean Intellectual Property Office, the disclosure of which is incorporated herein by reference in its entirety.

TECHNICAL FIELD

This disclosure relates generally to switching transformers, and more particularly, to switching transformers used in a wireless communication device receiver and/or transmitter.

DISCUSSION OF THE RELATED ART

A transformer may electromagnetically couple a primary circuit and a secondary circuit at a predetermined coupling coefficient, by using a magnetic flux induced by an alternating current (AC) flowing through a primary winding and a secondary winding.

A switching transformer is a device configured to change a voltage or current ratio between input and output sides of the transformer by means of a switching operation. In one application, a switching transformer may be used in a receiver configured to support carrier aggregation. Carrier aggregation is a technique by which a plurality of carrier signals ("carrier components") are merged within a wireless communication signal to thereby form a "carrier aggregated signal," where each carrier signal may occupy a respective bandwidth within a wider frequency range of the carrier aggregated signal. This type of receiver may use a transformer corresponding to each band/carrier component, where each transformer is part of circuitry for transforming and sampling the received signal. In general, however, the more transformers deployed on a chip, the larger the chip size. A switching transformer can be controlled to operate effectively in at least two bands. Since received signals may not include carrier components of all possible bands simultaneously, the use of one or more switching transformers in the receiver may reduce the total chip area allocated for transformers and thereby reduce chip size.

In a switching transformer of the related art, an induced magnetic flux may be lost due to the presence of a floating winding in a primary winding and/or a secondary winding. The loss in magnetic flux may impact performance of the switching transformer. Also, the switching transformer of the related art may not cover a desired range of frequency bands due to a limited switching operation.

SUMMARY

Embodiments of the inventive concept provide a switching transformer configured to independently control primary windings included in a primary circuit and second windings included in a secondary circuit in response to a switching control signal(s), and an electronic device including the switching transformer.

According to an aspect of the inventive concept, there is provided a switching transformer including a primary circuit including a first input/output (I/O) terminal, a plurality of primary windings, and primary switching circuitry including at least one switch configured to selectively connect the plurality of primary windings in series or in parallel, and a secondary circuit including a second I/O terminal, a plurality of secondary windings, and secondary switching circuitry including at least one switch configured to selectively connect the plurality of secondary windings in series or in parallel. Each of the primary switching circuitry and the secondary switching circuitry performs a switching operation based on a frequency band of an input signal received from the first I/O terminal or the second I/O terminal.

According to another aspect of the inventive concept, there is provided a switching transformer including a first I/O terminal including a single-ended terminal, a second I/O terminal including a differential terminal, a primary circuit including a plurality of primary windings and configured to receive a receive signal via the first I/O terminal and/or transmit a transmit signal from the first I/O terminal, a plurality of secondary windings mutually coupled to the plurality of primary windings and configured to output an output signal generated from the receive signal via the second I/O terminal, or input an input signal from which the transmit signal is generated, and switching circuitry configured to adjust an equivalent inductance value of the plurality of primary windings and an equivalent inductance value of the plurality of secondary windings based on a frequency of the first signal or the second signal.

According to another aspect of the inventive concept, there is provided an electronic device including a primary circuit including a first I/O terminal, a plurality of primary windings, and primary switching circuitry, the primary switching circuitry including at least one switch configured to selectively connect at least some of the plurality of primary windings in series or in parallel, a secondary circuit including a second I/O terminal, a plurality of secondary windings, and secondary switching circuitry, the secondary switching circuitry including at least one switch configured to selectively connect at least some of the plurality of secondary windings in series or in parallel, and control logic configured to output a switching control signal to the primary switching circuitry and the secondary switching circuitry to thereby activate one of a plurality of modes.

According to another aspect of the inventive concept, there is provided an operating method of a switching transformer. The operating method includes receiving an input signal through a first I/O terminal or a second I/O terminal, controlling at least one primary switch connected between a plurality of primary windings and at least one secondary switch connected between a plurality of secondary windings, based on a frequency of the input signal, and outputting an output signal through the plurality of primary windings and the plurality of secondary windings.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1:
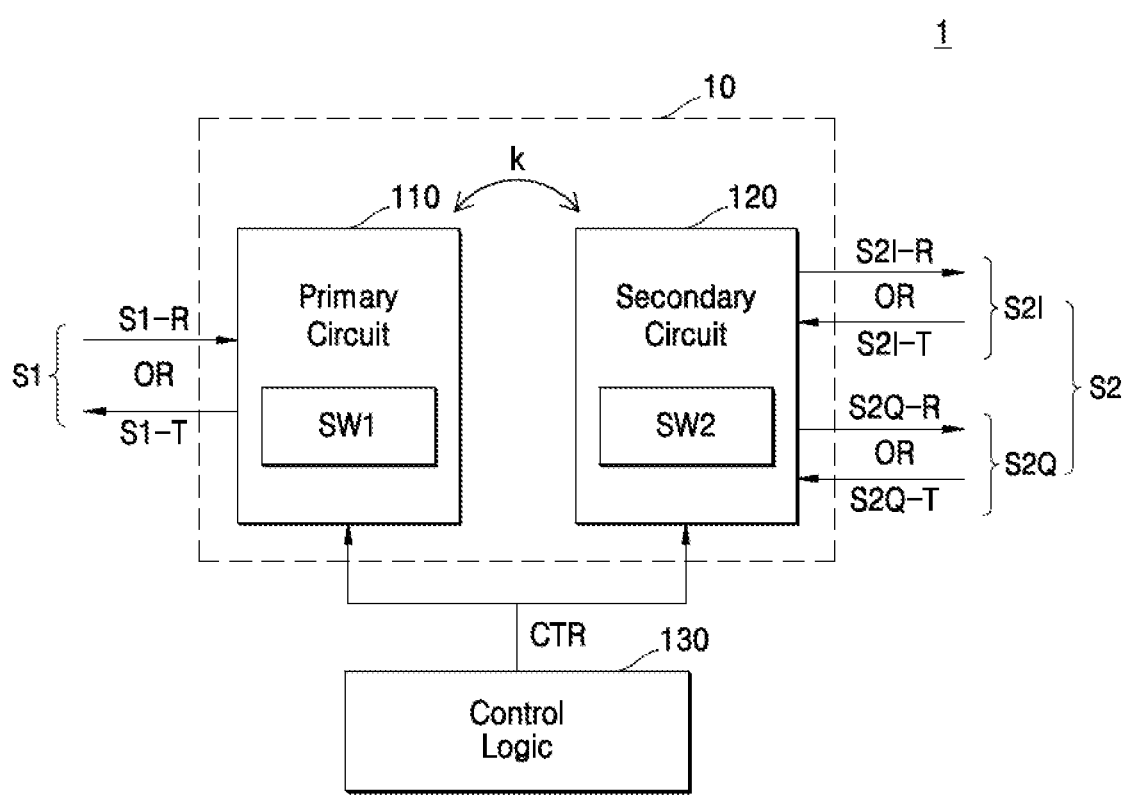
FIG. 1 is a block diagram of an electronic device according to an example embodiment.

Hereinafter, embodiments will be described in detail with reference to the accompanying drawings, in which like reference characters denote like elements or features.

Herein, terms such as "low frequency" and "high frequency" are relative terms to one another, and do not denote any particular frequency bands (such as the LF and HF bands).

FIG. 1 is a block diagram of an electronic device, 1, according to an example embodiment. The electronic device 1 may include a transformer 10 and control logic circuitry ("control logic") 130. Hereinafter, since the transformer 10 may include a plurality of switches, the transformer 10 may be referred to as a switching transformer. The transformer 10 may include a primary circuit 110 and a secondary circuit 120.

The electronic device 1 according to the example embodiment may be part of a receiver, a transmitter, or a transceiver. In a receive direction, the electronic device 1 may receive a first signal S1-R from a first external device via the primary circuit 110. The first signal S1-R may be a quadrature-modulated signal such as a signal modulated according to phase shift keying (PSK), frequency shift keying (FSK), quadrature amplitude modulation (QAM), orthogonal frequency division multiplexing (OFDM), frequency modulation (FM), and so forth. The electronic device 1 may transform the input signal S1-R to generate an output signal via the secondary circuit 120. This output signal is referred to as a second signal S2 (e.g., a "complex sinusoid") that may include an in-phase signal ("I signal") S2I-R and a quadrature-phase signal ("Q signal") S2Q-R.

In the transmit direction, the electronic device 1 may receive an input signal, also designated as a second signal S2, which may a complex sinusoid that includes an I signal S2I-T and a Q signal S2Q-T. Here, the input signal S2 may be transformed to generate a quadrature-modulated output signal S1-T which is transmitted to an external device via the primary circuit 110. Hereafter, a signal S1 will refer to either the receive signal S1-R or the transmit signal S1-T; an I signal S2I will refer to either the receive signal S2I-R or the transmit signal S2I-T; a Q signal S2Q will refer to either the receive signal S2Q-R or the transmit signal S2-T; and the signal S2 will refer to either the signals S2I-R and S2Q-R together or the signals S2I-T and S2Q-T together.

For example, the primary circuit 110 may include a single-ended terminal, and the first signal S1 may be a single-ended signal. For example, the secondary circuit 120 may include a differential terminal, the second signal S2 may be a differential signal, a "differential output" on receive or a "differential input" on transmit. As described above, the transformer 10 may serve as a balun. Meanwhile, the primary circuit 110 and the secondary circuit 120 may be electromagnetically coupled due to a coupling coefficient k.

Each of the primary circuit 110 and the secondary circuit 120 according to an example embodiment may include at least one switch, which may connect windings included in each of the primary circuit 110 and the secondary circuit 120 in series or in parallel. For example, primary switching circuitry SW1 may include at least one switch configured to connect a plurality of primary windings (e.g., LP1 and LP2 in FIG. 4) in series or in parallel. Also, secondary switching circuitry SW2 may include at least one switch configured to connect a plurality of secondary windings (e.g., LS1 and LS2 in FIG. 4) in series or in parallel.

The control logic 130 may output a switching control signal(s) CTR, for controlling the at least one switch, to the primary switching circuitry SW1 and the secondary switching circuitry SW2. For example, the switching control signal CTR may activate one of a plurality of modes through the control of the at least one switch.

In a first mode, the control logic 130 according to an example embodiment may output a first switching control signal to connect the plurality of primary windings in series and connect the plurality of secondary windings in series. For example, the first mode may be a low-frequency mode. The frequency band in the low-frequency mode may be a relatively low band among, e.g., two, three, or more candidate frequency bands or sub-bands within a wider spectrum collectively used for carrier aggregation. In an example, when a frequency of the input signal is less than a reference frequency, the control logic 130 may operate in the first mode.

In a second mode, the control logic 130 according to an example embodiment may output a second switching control signal to connect the plurality of primary windings in parallel and connect the plurality of secondary windings in parallel. For example, the second mode may be a high-frequency mode. The frequency band in the high frequency mode may be a relatively high band among, e.g., two, three or more candidate frequency bands or sub-bands within a wider spectrum collectively used for carrier aggregation. In an example, when the frequency of the input signal is greater than or equal to the reference frequency, the control logic 130 may operate in the second mode.

In a third mode, the control logic 130 according to an example embodiment may output a third switching control signal to connect the plurality of primary windings in series and connect the plurality of secondary windings in parallel. For instance, the transformer 10 may improve the linearity of the output signal in the third mode. Also, the transformer 10 may implement a high input impedance for a performance benefit with a relatively small amplifier (e.g., low-noise amplifier or power amplifier). In this case, the transformer 10 may implement an optimum impedance corresponding to a particular amplifier design or type.

In a fourth mode, the control logic 130 according to the example embodiment may output a fourth switching control signal to connect the plurality of primary windings in parallel and connect the plurality of secondary windings in series. For example, the transformer 10 may improve a gain and a quality factor of the input signal in the fourth mode. Also, the transformer 10 may implement a low input impedance for a performance benefit with a relatively large amplifier (e.g., low-noise amplifier or power amplifier). Here, the transformer 10 may implement an optimum impedance for a specific amplifier design or type.

Figure 2A:
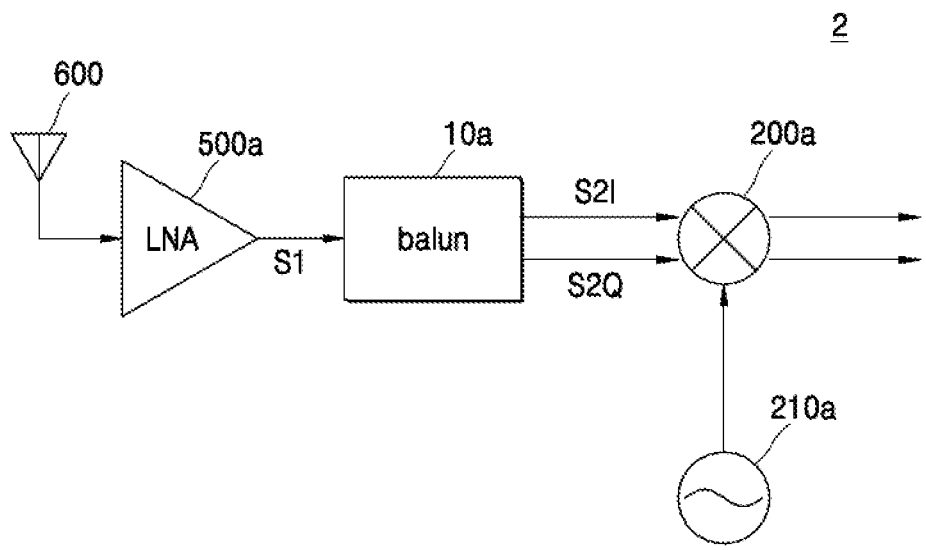
FIG. 2A is a block diagram of a receiver according to an example embodiment.
Figure 2B:
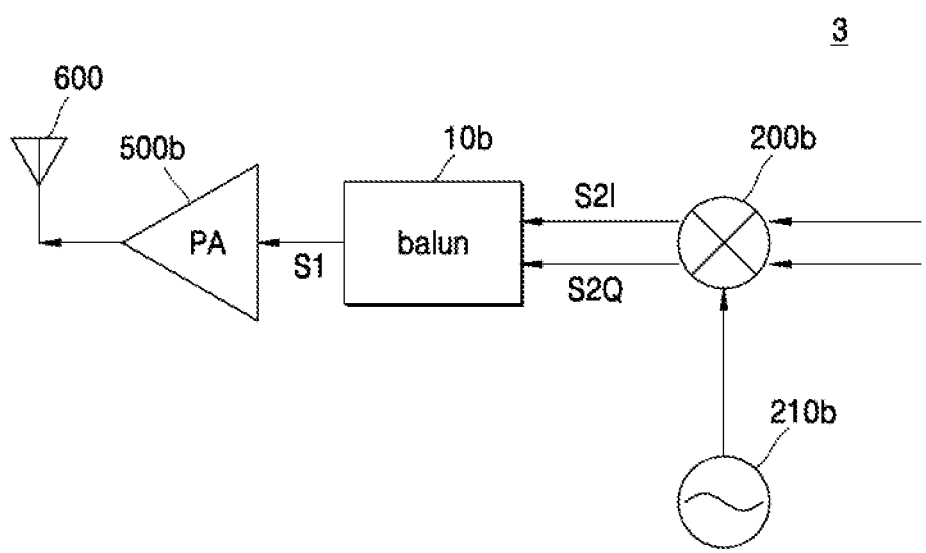
FIG. 2B is a block diagram of a transmitter according to an example embodiment.

FIG. 2A is a block diagram of a receiver 2 according to an example embodiment. FIG. 2B is a block diagram of a transmitter 3 according to an example embodiment. The receiver 2 and the transmitter 2 may or may not be part of the same transceiver.

Referring to FIG. 2A, the receiver 2 may include a mixer 200a, a local oscillator 210a, a transformer 10a, a low-noise amplifier 500a, and an antenna 600. The antenna 600 may receive an external signal having spectral components of a low or high frequency, and the low-noise amplifier 500a may amplify the external signal and output a first signal S1. As described above with reference to FIG. 1, the first signal S1 may be a single-ended signal.

The transformer 10a may include a first I/O terminal and a second I/O terminal. The first I/O terminal may receive a signal output by the low-noise amplifier 500a, and the second I/O terminal may output a transformed signal to the mixer 200a. That is, the transformer 10a may receive the first signal S1, which is a single-ended signal, and output a second signal S2 (including the above-discussed I signal S2I and Q signal S2Q), which is a differential signal. Accordingly, the transformer 10 may serve as, for example, a balun.

Meanwhile, the local oscillator 210a may output a reference signal, and the mixer 200a may down-convert the second signal S2 based on the reference signal. For example, the down-converted signal may pass through a modem and be used to process various signals.

According to an example embodiment, the transformer 10a may control various characteristics of the receiver 2. In an example, to increase the linearity of the receiver 2, the transformer 10a may perform a switching operation to operate in the third mode. In another example, to improve gain and noise characteristics of the receiver 2, the transformer 10a may perform a switching operation to operate in the fourth mode. In another example, to increase a bandwidth of the receiver 2, the transformer 10a may perform a switching operation to operate in the second mode.

Referring to FIG. 2B, the transmitter 3 may include a mixer 200b, a local oscillator 210b, a transformer 10b, a power amplifier 500b, and an antenna 600. For example, the mixer 200b may up-convert a signal output by the modem. The up-conversion may be performed based on a reference signal output by the local oscillator 210b. The mixer 200b may output the up-converted second signal S2 (which includes the signals S2I and S2Q). The transformer 10b may include a first I/O terminal and a second I/O terminal. The first I/O terminal may receive a signal output by the mixer 200b, and the second I/O terminal may output a transformed signal to the power amplifier 500b. That is, the transformer 10b may receive the second signal S2, which is a differential signal, and output a first signal S1, which is a single-ended signal. Accordingly, the transformer 10b may function as a balun.

The power amplifier 500b may amplify the first signal S1, and the amplified first signal S1 may be output through the antenna 600 to free space. It is noted here, that with suitable T/R circuitry (not shown), it may be possible to use the same transformer 10a for both transmit and receive operations.

According to an example embodiment, the transformer 10b may control various characteristics of the transmitter 3. In an example, to increase the linearity of the transmitter 3, the transformer 10b may perform a switching operation to operate in the third mode. In another example, to improve gain and noise characteristics of the transmitter 3, the transformer 10b may perform a switching operation to operate in the fourth mode. In yet another example, to increase a bandwidth of the transmitter 3, the transformer 10b may perform a switching operation to operate in the second mode.

As described above, the transformer 10a according to the example embodiment may be provided between the low-noise amplifier 500a and the mixer 200a, which are included in the receiver 2, and the transformer 10b according to the example embodiment may be provided between the power amplifier 500b and the mixer 200b, which are included in the transmitter 3. The transformers 10a and 10b may perform conversion between a balanced signal and an unbalanced signal.

Figure 3:
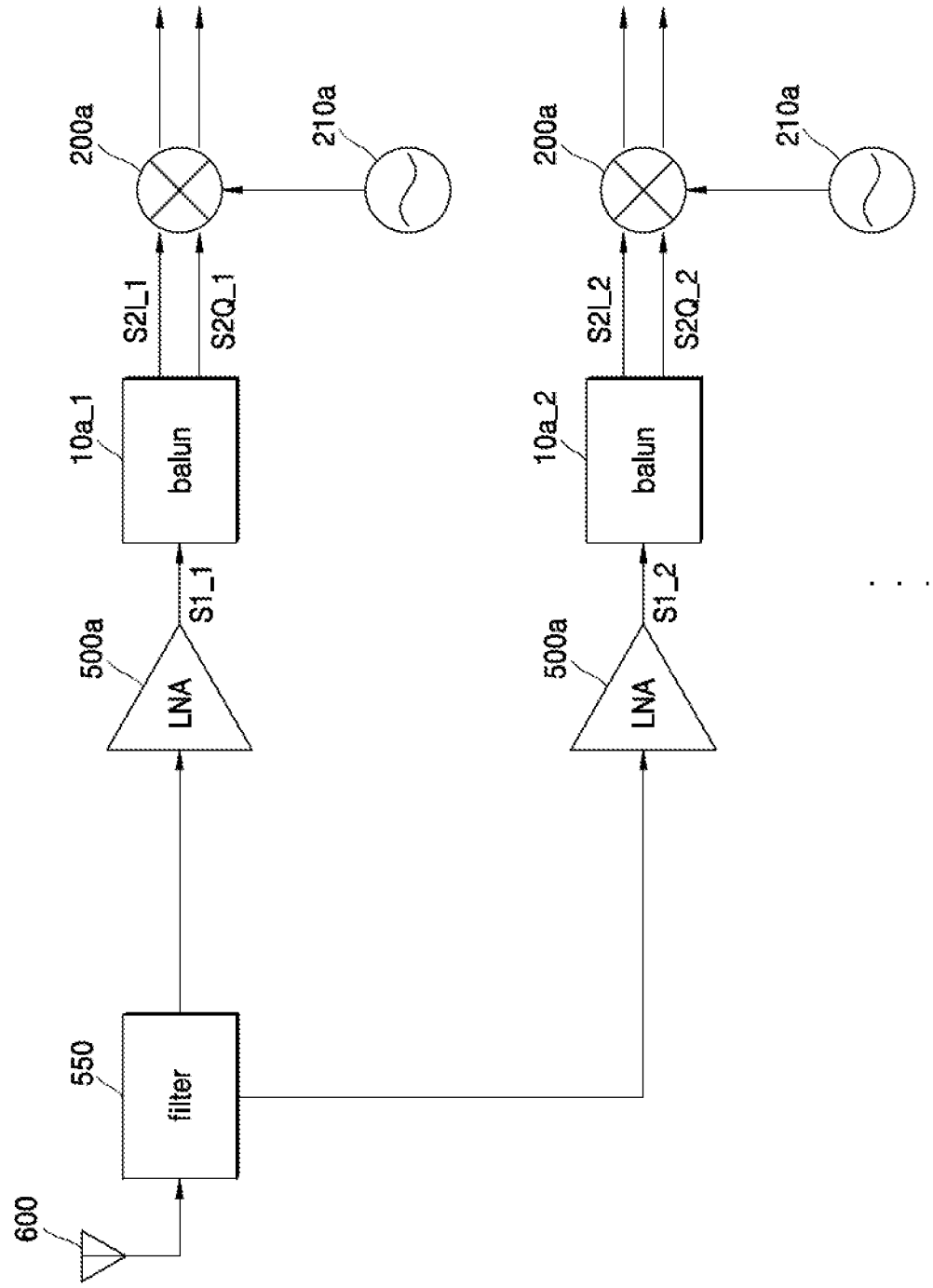
FIG. 3 is a block diagram of a receiver configured to support carrier aggregation according to an example embodiment.

FIG. 3 is a block diagram of a receiver configured to support carrier aggregation according to an example embodiment. Redundant description already provided with reference to FIG. 2A will be omitted.

Referring to FIG. 3, an antenna 600 may receive an external signal including a plurality of carrier components. A filter 550 may divide the signal received from the antenna 600 into a plurality of frequency bands and output the divided signals to a plurality of low-noise amplifiers 500a, respectively. For example, a transformer 10a_1 may receive a first signal S1_1 having a first set of one or more of the frequency bands and operate in a first mode (e.g., a low-frequency mode). A transformer 10a_2 may receive a first signal S1_2 having a second, different set of one or more of the frequency bands and operate in a second mode (e.g., a high-frequency mode). The receiver 4 may also include one or more additional transformers 10a_i (e.g., i=three or more), each coupled between a respective LNA 500a and mixer 200a. For example, any of the transformers 10a1, 10a_2, . . . may be configured to selectively operate, by means of a switching control signal CTR, in either a low-frequency mode or a high-frequency mode, where the low-frequency mode of one transformer 10a is a mode for optimally transforming a signal of a different frequency band than that of another transformer 10a (and the same applies for the high frequency mode). For example, a different reference frequency may be associated with each transformer 10a. For instance, when the frequency of the input signal S1_1 is below a first reference frequency, the transformer 10a_1 may operate in a first low frequency mode optimized for a first low frequency band. When the frequency of the input signal S1_1 is above the first reference frequency, the transformer 10a_1 may operate in a first high frequency mode optimized for a first high frequency band. When the frequency of the input signal S1_2 is below a second, different reference frequency, the transformer 10a_2 may operate in a second low frequency mode optimized for a second, different low frequency band. When the frequency of the input signal S1_2 is above the second reference frequency, the transformer 10a_2 may operate in a second high frequency mode optimized for a second, different high frequency band. Meanwhile, a transmitter configured to support carrier aggregation may operate in an analogous manner to the receiver of FIG. 3, by including a plurality of transformers 10b, and a plurality of transmit amplifiers, each for amplifying a different set of frequency bands.

Referring to FIGS. 1, 2A, 2B, and 3, the electronic device 1, the transformer 10, the receiver 2, the transmitter 3, and the receiver 4 according to the example embodiments may operate in various communication environments. For example, the electronic device 1, the transformer 10, the receiver 2, the transmitter 3, and the receiver 4 according to the example embodiments may perform communications based on 2G, 3G, 4G, 5G, and/or any compatible communication standard. For example, a frequency band designated for communication may be wider in recent communication standards such as 4G and 5G as compared to earlier standards. For instance, in a carrier aggregation system there may be N possible frequency bands within an overall allocated frequency spectrum, and N dedicated transformers, each compatible with one of the frequency bands may be provisioned in a conventional system. However, chip size may be correlated with the number of transformers on the chip, and there may be only M<N frequency bands used for communication at any given time. The transformer 10 as described herein is capable of generating various numbers of turns according to a frequency of an input signal, and is therefore operational over a selectable one of the frequency bands. Thus, a smaller number of transformers 10 may be substituted for such conventional transformers, resulting in a smaller chip size. In addition, the transformer 10 may avoid a flux reduction problem exhibited by related art switchable transformers.

Figure 4:
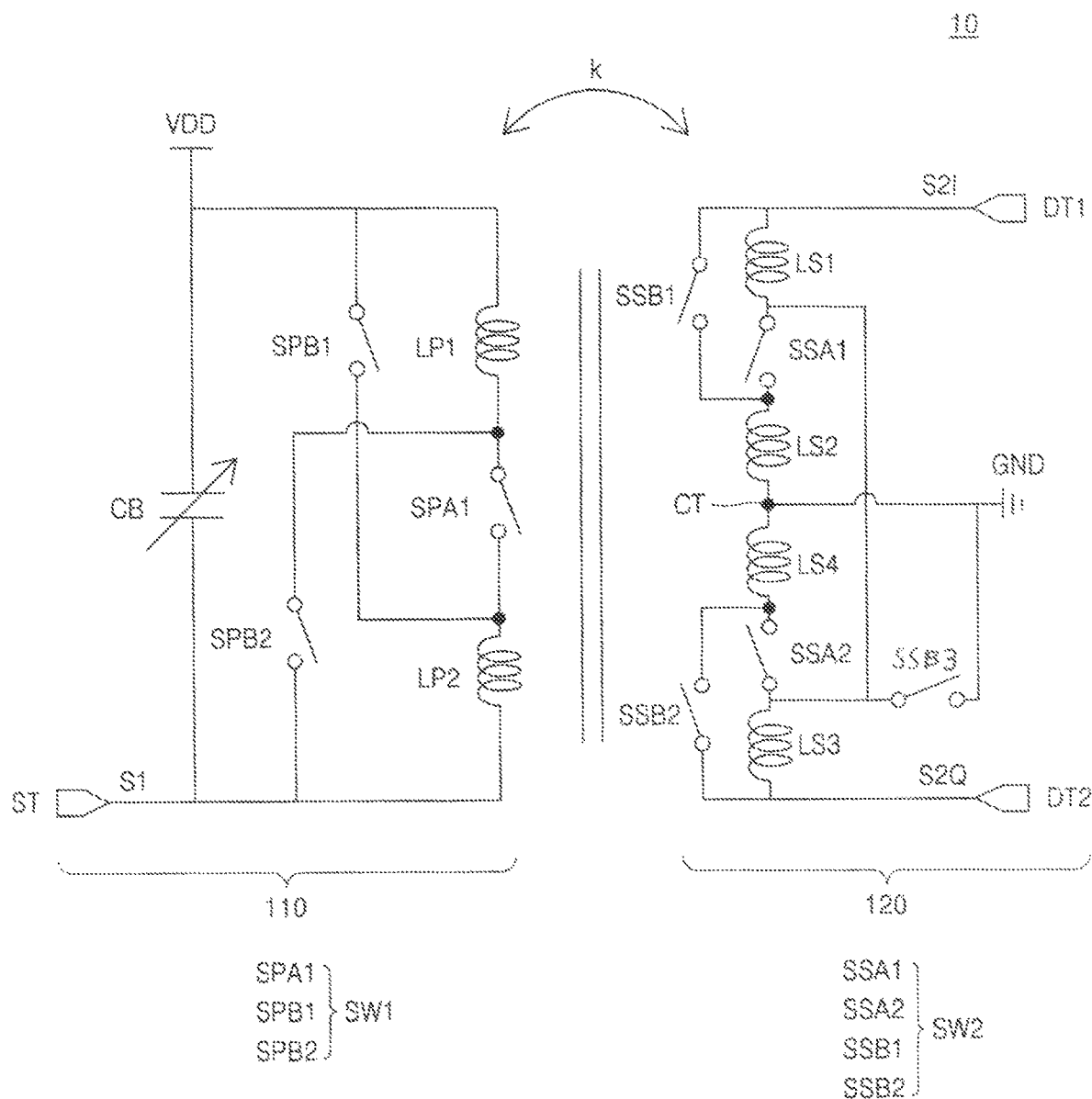
FIG. 4 is a circuit diagram of a transformer according to an example embodiment.

FIG. 4 is a circuit diagram of a transformer 10 according to an example embodiment. Hereinafter, FIG. 4 will be described with reference to the reference numerals of FIG. 1.

Referring to FIG. 4, the transformer 10 may include a primary circuit 110 configured to receive or transmit a first signal S1 via a first I/O terminal ST and a secondary circuit 120 configured to respectively output or input a second signal S2 (composed of an I signal S2I and a Q signal S2Q) via a second I/O terminal DT1 and DT2 (collectively considered an I/O terminal).

The primary circuit 110 according to the example embodiment may include the first I/O terminal ST, a plurality of primary windings (e.g., LP1 and LP2) connected to the first I/O terminal ST, and primary switching circuitry SW1. The plurality of primary windings may include a first primary winding LP1 and a second primary winding LP2. The primary switching circuitry SW1 may include a plurality of primary switches (e.g., SPA1, SPB1, and SPB2). The primary switching circuitry SW1 may include a first primary switch SPA1, a second primary switch SPB1, and a third primary switch SPB2.

The primary switches SPA1, SPB1, and SPB2 may be configured to connect the primary windings LP1 and LP2 in series or in parallel.

The secondary circuit 120 according to the example embodiment may include the second I/O terminal DT1 and DT2, a plurality of secondary windings (e.g., LS1, LS2, LS3, and LS4) connected to the second I/O terminal DT1 and DT2, and a secondary switching circuitry SW2. The second I/O terminal DT1 and DT2 may include a first differential terminal DT1 and a second differential terminal DT2. For example, the second I/O terminal DT1 and DT2 may transmit differential signals. The differential signals may include the I signal S2I and the Q signal S2Q. The first differential terminal DT1 may transceive the I signal S2I, and the second differential terminal DT2 may transceive the Q signal S2Q.

The plurality of secondary windings may include a first secondary winding LS1, a second secondary winding LS2, a third secondary winding LS3, and a fourth secondary winding LS4. In some embodiments, the first secondary winding LS1 and the third secondary winding LS3 may have substantially the same inductance, and the second secondary winding LS2 and the fourth secondary winding LS4 may have substantially the same inductance. In another embodiment, the first secondary winding LS1, the second secondary winding LS2, the third secondary winding LS3, and the fourth secondary winding LS4 may have different inductances. The secondary switching circuitry SW2 may include a plurality of secondary switches (e.g., SSA1, SSA2, SSB1, SSB2, and SSB3). The secondary switching circuitry SW2 may include a first secondary switch SSA1, a second secondary switch SSA2, a third secondary switch SSB1, a fourth secondary switch SSB2, and a fifth secondary switch SSB3.

The secondary switches SSA1, SSA2, SSB1, SSB2, and SSB3 may be configured to connect the first to fourth secondary windings LS1, LS2, LS3, and LS4 in series or in parallel. Meanwhile, the first to fourth secondary windings LS1, LS2, LS3, and LS4 may be mutually coupled to the primary windings LP1 and LP2.

According to an example embodiment, one end of each of the first secondary winding LS1 and the second secondary winding LS2 may be connected to the first differential terminal DT1, and another end thereof may be connected to a center tab node CT. Also, one end of each of the third secondary winding LS3 and the fourth secondary winding LS4 may be connected to the second differential terminal DT2, and another end thereof may be connected to the center tab node CT. For instance, the center tab node CT may be provided between the second secondary winding LS2 and the fourth secondary winding LS4 and connected to a ground terminal GND.

According to an example embodiment, the first secondary switch SSA1 may be provided between the first secondary winding LS1 and the second secondary winding LS2. The second secondary switch SSA2 may be provided between the third secondary winding LS3 and the fourth secondary winding LS4. The third secondary switch SSB1 may be provided between the first differential terminal DT1 and the second secondary winding LS2. The fourth secondary switch SSB2 may be provided between the fourth secondary winding LS4 and the second differential terminal DT2. The fifth secondary switch SSB3 may be provided between the first secondary winding LS1, the third secondary winding LS3, and the ground terminal GND.

According to an example embodiment, the primary circuit 110 may include a supply terminal VDD. The supply terminal VDD may supply a fixed direct-current (DC) voltage to a circuit element connected thereto. For example, the supply terminal VDD may supply a fixed DC voltage (e.g. a bias voltage) to a low-power amplifier. Alternatively, the supply terminal VDD may be an alternating-current (AC) supply terminal or a ground terminal.

According to an example embodiment, the primary circuit 110 may include a capacitor CB. One end of the capacitor CB may be connected to the first I/O terminal ST, and another end thereof may be connected to the ground terminal VDD. In an example, the capacitor CB may be a variable capacitor. In another example, the capacitor CB may be a capacitor bank array including a plurality of capacitors. Meanwhile, the capacitor CB may be provided to adjust impedances of circuit elements connected thereto. Alternatively, the capacitor CB may resonate with undesired reactance elements, thereby neutralizing the reactance elements.

According to an example embodiment, the primary switching circuitry SW1 and the secondary switching circuitry SW2 may perform a switching operation based on an input signal (e.g., the first signal S1 or the second signal S2) received from the first I/O terminal ST or the second I/O terminal D1 and DT2.

According to an example embodiment, based on a frequency of the input signal, a switching circuitry may adjust an equivalent inductance of the primary windings LP1 and LP2 and an equivalent inductance of the first to fourth secondary windings LS1, LS2, LS3, and LS4. The switching circuitry may include the primary switching circuitry SW1 and the secondary switching circuitry SW2.

In an example, when the frequency of the input signal is low, the first primary switch SPA1 may be turned on (short-circuited), and the second primary switch SPB1 and the third primary switch SPB2 may be turned off (opened). In another example, when the frequency of the input signal is high, the first primary switch SPA1 may be turned off, and the second primary switch SPB1 and the third primary switch SPB2 may be turned on.

According to an example embodiment, when the frequency of the input signal is low, the switching circuitry SW1 may connect the primary windings LP1 and LP2 in series and increase the equivalent inductance of the primary circuit 110. Also, the switching circuitry may connect the first to fourth secondary windings LS1, LS2, LS3, and LS4 in series and increase the equivalent inductance of the secondary circuit 120. In another example, when the frequency of the input signal is high, the switching circuitry SW1 may connect the primary windings LP1 and LP2 in parallel and reduce the equivalent inductance of the primary circuit 110. Also, the switching circuitry SW2 may connect the first to fourth secondary windings LS1, LS2, LS3, and LS4 in parallel and reduce the equivalent inductance of the secondary circuit 120.

Figure 5:
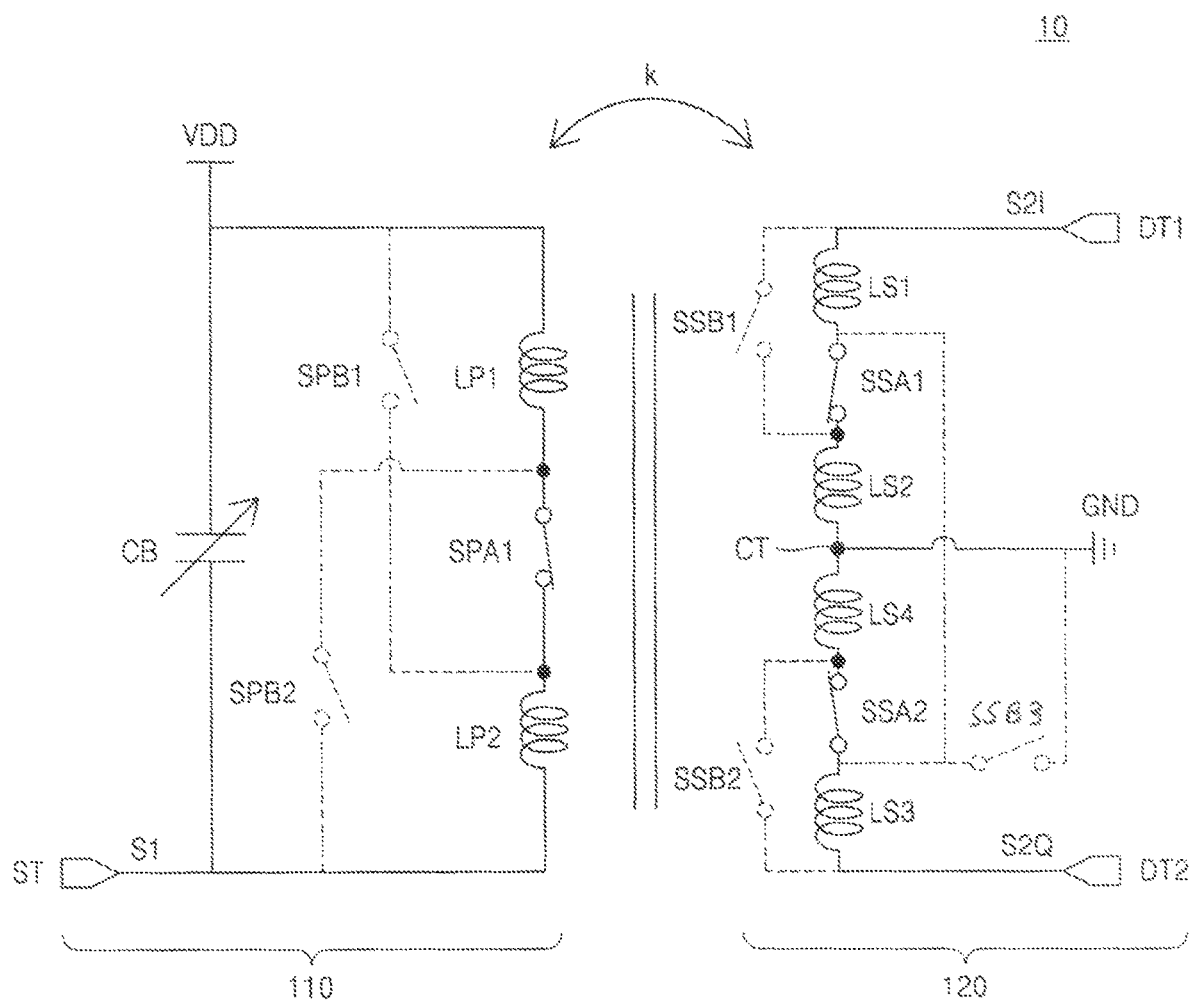
FIG. 5 is a circuit diagram of a transformer configured to perform a first switching operation according to an example embodiment.
Figure 6:
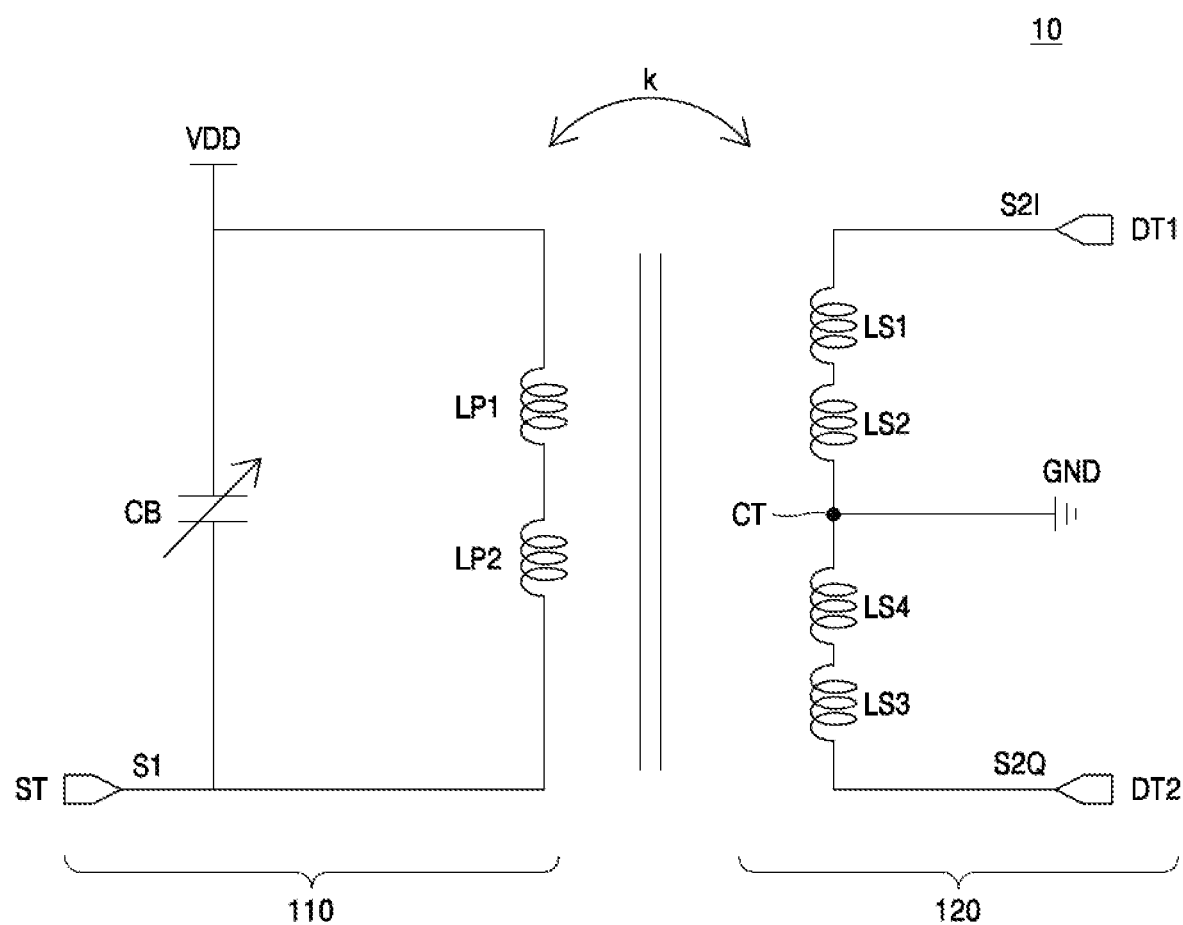
FIG. 6 is an equivalent circuit diagram of the transformer of FIG. 5.

FIG. 5 is a circuit diagram of a transformer 10 configured to perform a first switching operation according to an example embodiment, and FIG. 6 is an equivalent circuit diagram of FIG. 5.

In FIG. 5, a dashed line may be understood as a portion in which no current flows. For example, a switch may be turned off (or opened) or a potential difference between nodes of both ends of the dashed line may be the same. Also, FIG. 5 may be understood as a circuit diagram showing a case in which the transformer 10 or a control logic 130 operates in a first mode. FIGS. 5 and 6 will be described with reference to the reference numerals of FIG. 1.

Referring to FIG. 5, the transformer 10 may receive a low-band signal S1 through a first I/O terminal ST, transform the low-band signal S1, and output a transformed signal S2 through a second I/O terminal DT1 and DT2. The opposite case may also be possible. For example, the transformer 10 may receive a low-band signal S2 through the second I/O terminal DT1 and DT2 and output a transformed signal S1 through the first I/O terminal ST. That is, an electronic device 1 including the transformer 10 may perform wired or wireless communication using a communication signal having a low-frequency band. When the input signal having the low-frequency band is input, a winding may have a low induced magnetic flux. Accordingly, a length and area of the entire winding may be increased due to windings connected in series, and a coupling efficient k between a primary circuit 110 and a secondary circuit 120 may be improved.

According to an example embodiment, when the frequency of the input signal is less than a reference frequency, primary switching circuitry SW1 and secondary switching circuitry SW2 may perform a first switching operation. For example, the first switching operation may be an operation of the primary switching circuitry SW1 and the secondary switching circuitry SW2, which includes connecting some or all of a plurality of primary windings (e.g., first and second primary windings LP1 and LP2) in series and connecting some or all of a plurality of secondary windings (e.g., first to fourth secondary windings LS1, LS2, LS3, and LS4) in series.

According to an example embodiment, the primary switching circuitry SW1 and the secondary switching circuitry SW2 may operate in response to a switching control signal CTR, which is based on the frequency of the input signal. For example, the control logic 130 may output the switching control signal CTR. When the frequency of the input signal is less than the reference frequency, the switching control signal CTR may command the primary switching circuitry SW1 and the secondary switching circuitry SW2 to perform the first switching operation. For example, the switching control signal CTR may command a first primary switch SPA1, a first secondary switch S SA1, and a second secondary switch SSA2 to be turned on. Conversely, when the first and second primary windings LP1 and LP2 or the first to fourth secondary windings LS1, LP2, LS3, and LS4 are connected in parallel (e.g., a second mode), the control logic 130 may output a switching control signal CTR for commanding an inverted switching operation to the primary switching circuitry SW1 and the secondary switching circuitry SW2.

Referring to FIG. 6, when the frequency of the input signal is less than the reference frequency, an equivalent inductance of the first and second primary windings LP1 and LP2 may increase. That is, the first primary winding LP1 and the second primary winding LP2 may be connected in series, and the equivalent inductance may be the sum of respective inductances of the first and second primary windings LP1 and LP2 connected in series. Similarly, when the frequency of the input signal is less than the reference frequency, an equivalent inductance of the first to fourth secondary windings LS1, LP2, LS3, and LS4 may increase. Inductances of the first secondary winding LS1 and the second secondary winding LS2 may be summed to increase an equivalent inductance thereof. Also, inductances of the third secondary winding LS3 and the fourth secondary winding LS4 may be summed to increase an equivalent inductance thereof. Conversely, when the first and second primary windings LP1 and LP2 or the first to fourth secondary windings LS1, LP2, LS3, and LS4 are connected in parallel, the equivalent inductance thereof may be reduced. The latter condition will be described below with reference to FIGS. 7 and 8.

Figure 7:
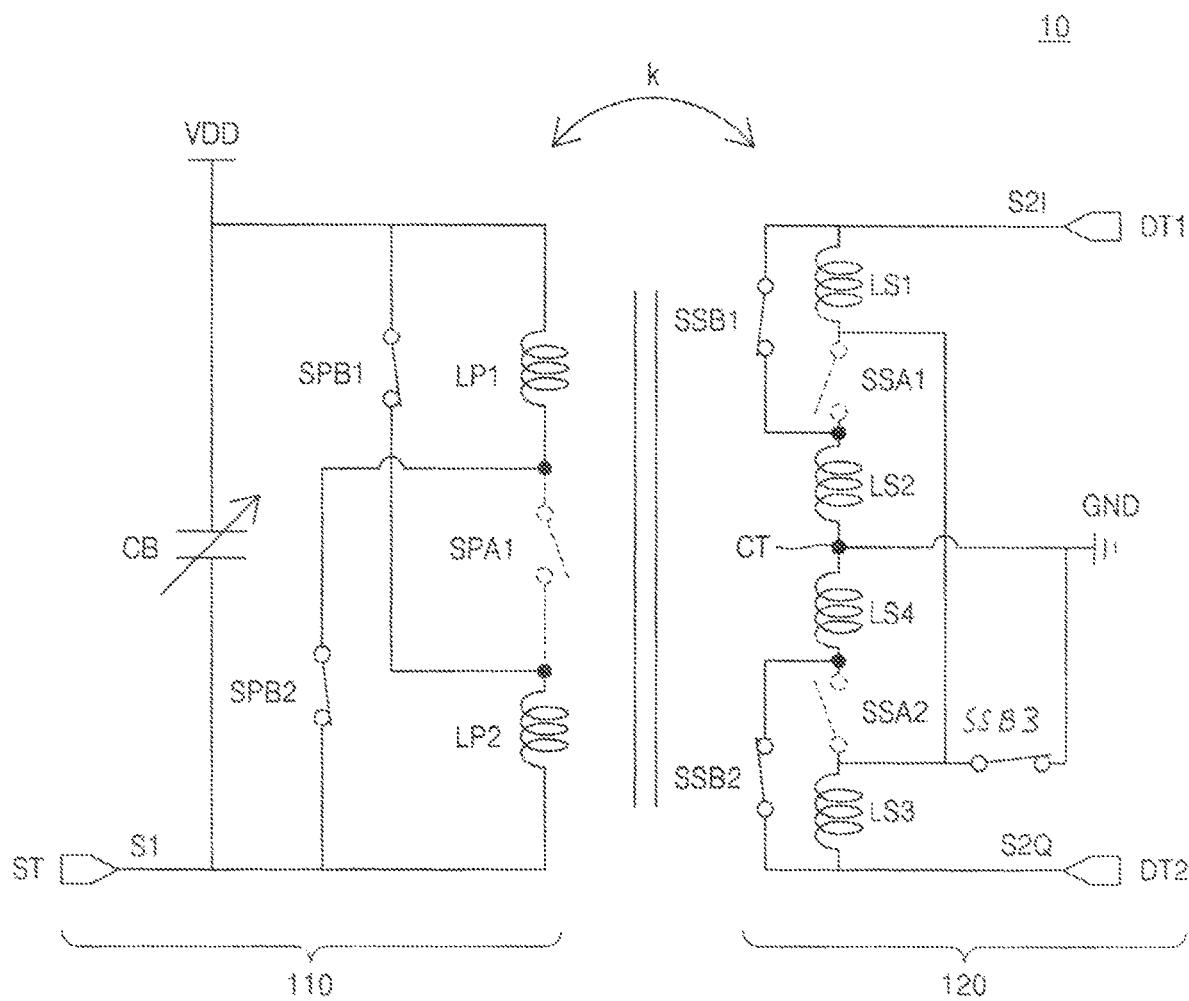
FIG. 7 is a circuit diagram of a transformer configured to perform a second switching operation according to an example embodiment.
Figure 8:
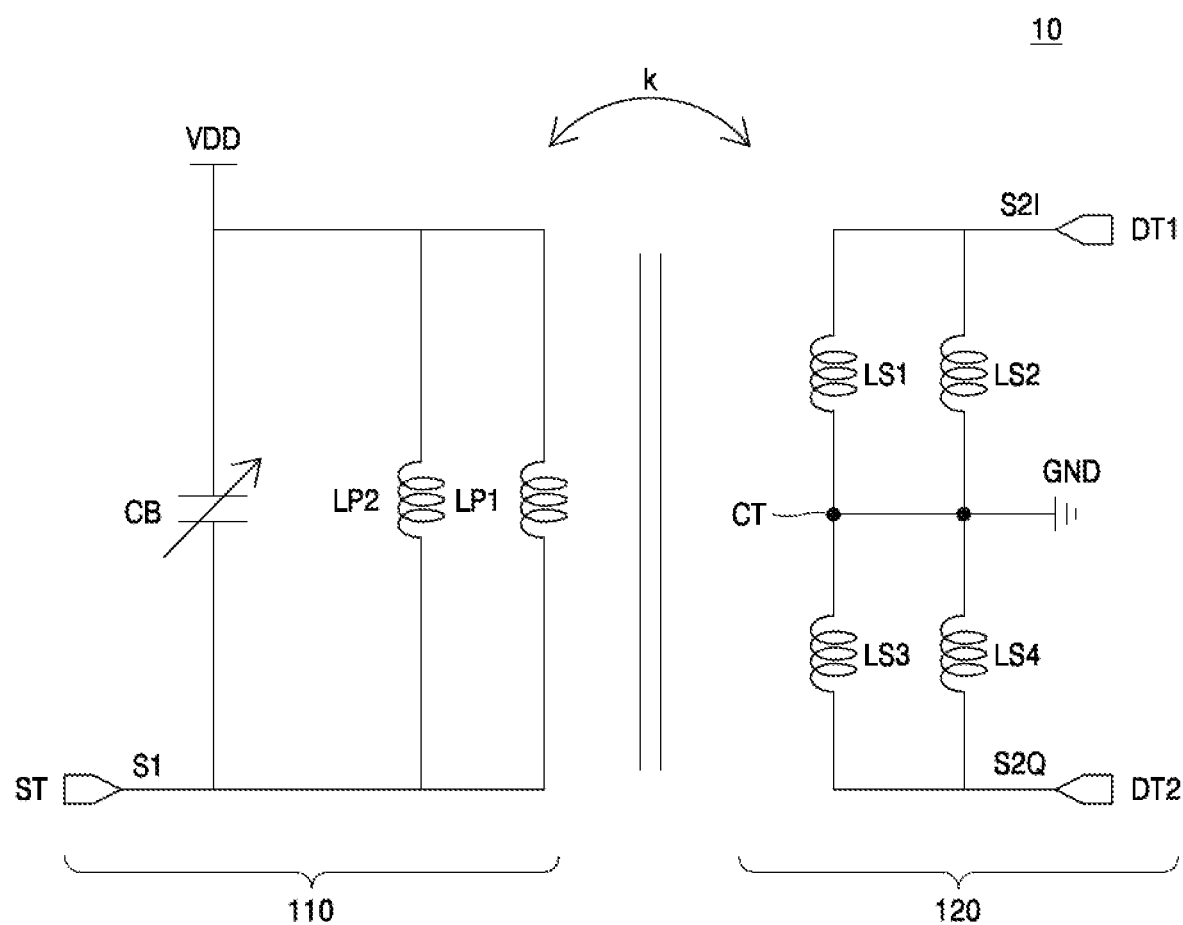
FIG. 8 is an equivalent circuit diagram of the transformer of FIG. 7.

FIG. 7 is a circuit diagram of a transformer 10 configured to perform a second switching operation according to an example embodiment, and FIG. 8 is an equivalent circuit diagram of FIG. 7.

In FIG. 7, a dashed line may be understood as a portion in which no current flows. For example, a switch may be turned off (opened) or a potential difference between nodes of both ends of the dashed line may be the same. Also, FIG. 7 may be understood as a circuit diagram showing a case in which the transformer 10 or a control logic 130 operates in a second mode. FIGS. 7 and 8 will be described with reference to the reference numerals of FIG. 1.

Referring to FIG. 7, the transformer 10 may receive a high-band signal S1 through a first I/O terminal ST, transform the high-band signal S1, and output a transformed signal S2 through a second I/O terminal DT1 and DT2. The opposite case may also be possible. For example, the transformer 10 may receive a high-band signal S2 through the second I/O terminal DT1 and DT2 and output a transformed signal S1 through the first I/O terminal ST. That is, an electronic device 1 including the transformer 10 may perform wired or wireless communication using a communication signal having a high-frequency band. When the input signal having the high-frequency band is received, reducing an equivalent inductance may be advantageous in terms of a coupling coefficient k, energy loss, and/or noise factor. Accordingly, windings included in a primary circuit 110 and a secondary circuit 120 may be connected in parallel. The equivalent inductance may be reduced due to the windings connected in parallel. Also, when the equivalent inductance is reduced, the windings may be designed with larger areas (as compared to related art designs and/or compared to a single winding) and thus the coupling coefficient k may be further increased.

According to an example embodiment, when the frequency of the input signal is greater than the reference frequency, the primary switching circuitry SW1 and the secondary switching circuitry SW2 may perform a second switching operation. For example, the second switching operation may be an operation of the primary switching circuitry SW1 and the secondary switching circuitry SW2, which includes connecting at least some of a plurality of primary windings (e.g., first and second primary windings LP1 and LP2) in parallel and connecting at least some of a plurality of secondary windings (e.g., first to fourth secondary windings LS1, LS2, LS3, and LS4) in parallel.

According to an example embodiment, the primary switching circuitry SW1 and the secondary switching circuitry SW2 may operate in response to a switching control signal CTR, which is based on the frequency of the input signal. For example, when the frequency of the input signal is greater than the reference signal, the switching control signal CTR may command the primary switching circuitry SW1 and the secondary switching circuitry SW2 to perform the second switching operation. For example, the switching control signal CTR may command a first primary switch SPA1, a first secondary switch SSA1, and a second secondary switch SSA2 to be turned off and to command all of the other switches to be turned on.

Referring to FIG. 8, when the frequency of the input signal is greater than the reference frequency, an equivalent inductance of the first and second primary windings LP1 and LP2 may be reduced. That is, the first primary winding LP1 may be connected in parallel to the second primary winding LP2. The equivalent inductance may be a value obtained by performing a parallel operation on respective inductances of the first and second primary windings LP1 and LP2 connected in parallel. Similarly, when the frequency of the input signal is greater than the reference frequency, an equivalent inductance of the first to fourth secondary windings LS1, LP2, LS3, and LS4 may be reduced. A parallel operation may be performed on inductances of the first secondary winding LS1 and the second secondary winding LS2 to reduce an equivalent inductance thereof. Also, a parallel operation may be performed on inductances of the third secondary winding LS3 and the fourth secondary winding LS4 to reduce an equivalent inductance thereof.

Figure 9:
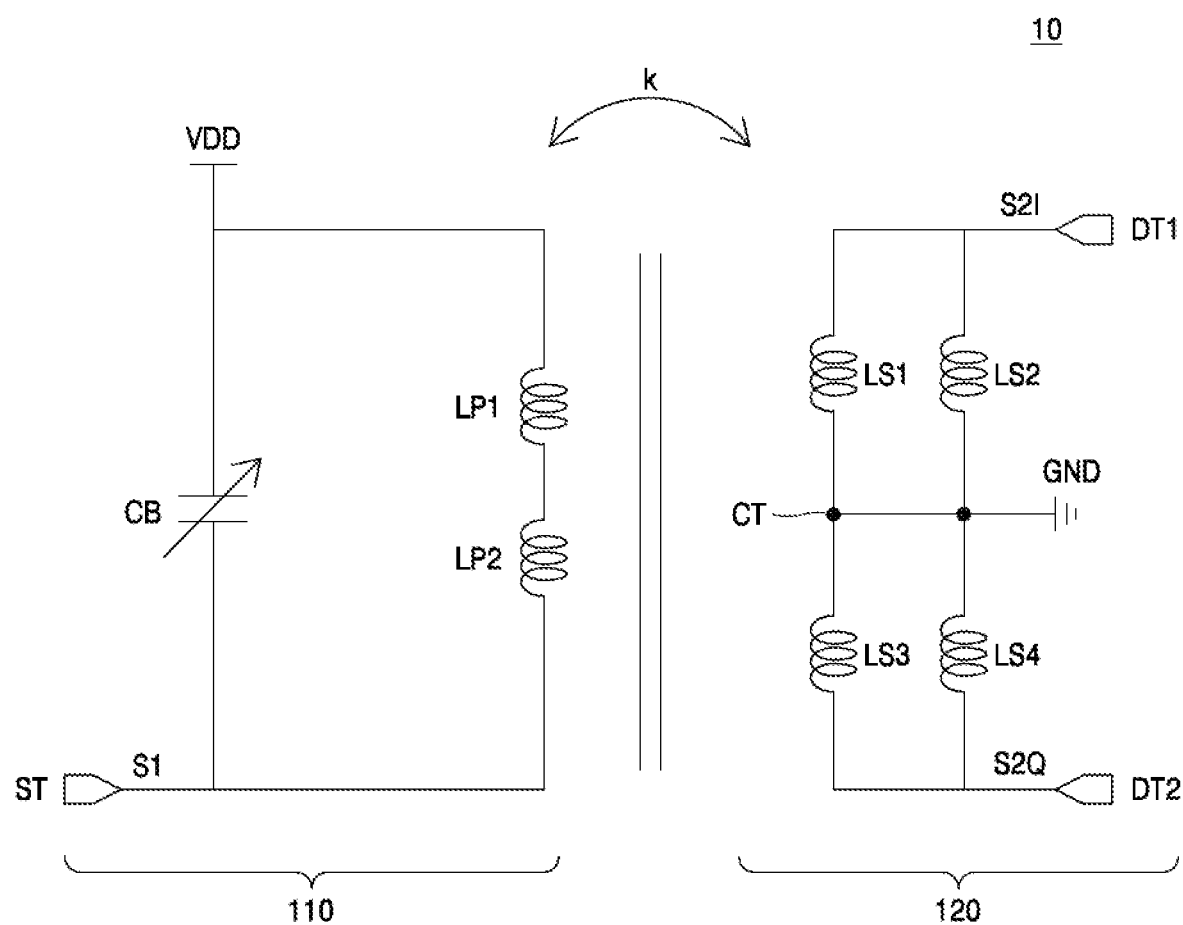
FIG. 9 is an equivalent circuit diagram for explaining a transformer in which a primary circuit performs a first switching operation and a secondary circuit performs a second switching operation, according to an example embodiment.

FIG. 9 is an equivalent circuit diagram for explaining a transformer 10 in which a primary circuit performs a first switching operation and a secondary circuit performs a second switching operation, according to an example embodiment.

Also, FIG. 9 may be also interpreted as an equivalent circuit of the transformer 10 as controlled by control logic 130, which operates in a third mode. FIG. 9 will be described with reference to the reference numerals of FIGS. 1, 2B, and 4.

In the transformer 10 according to the example embodiment, some or all of a plurality of primary windings (e.g., LP1 and LP2) may be connected in series, and some or all of a plurality of secondary windings (e.g., LS1, LS2, LS3, and LS4) may be connected in parallel. Thus, an equivalent inductance of the primary windings LP1 and LP2 may increase, while an equivalent inductance of the secondary windings LS1, LS2, LS3, and LS4 may be reduced. For example, the number of windings of the primary circuit 110 may increase, while the number of windings of the secondary circuit 120 may be reduced. For example, when a winding ratio ("turn ratio") of the primary circuit 110 to the secondary circuit 120 is about 1:1, the linearity of a signal output by the transformer 10 or an electronic device 1 may be increased. In addition, when the electronic device 1 operates as a transmitter, a power amplifier 500b having a high gain may be connected to a first I/O terminal ST. An impedance to the power amplifier 500b having the high gain may be implemented as a high input impedance.

Figure 10:
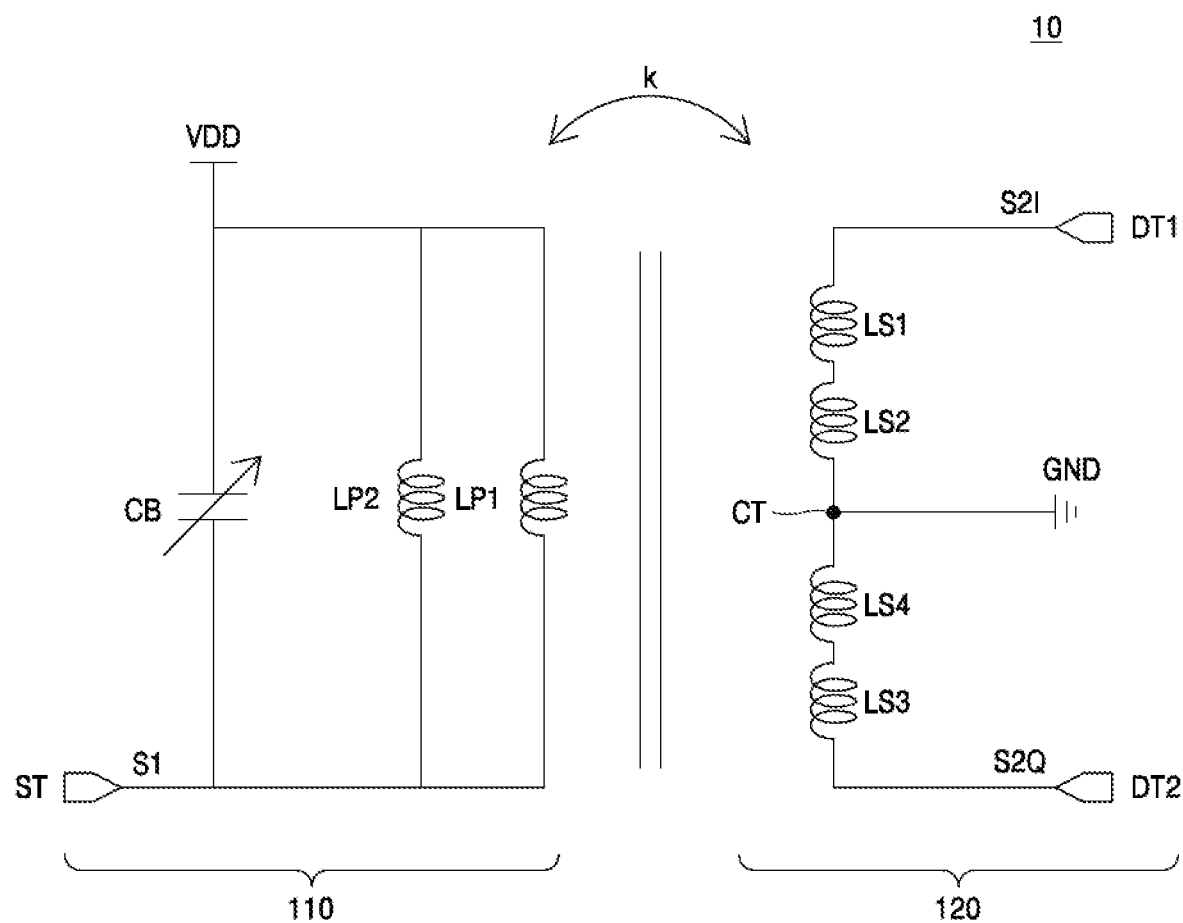
FIG. 10 is an equivalent circuit diagram for explaining a transformer in which a primary circuit performs a second switching operation and a secondary circuit performs a first switching operation, according to an example embodiment.

FIG. 10 is an equivalent circuit diagram for explaining a transformer 10 in which a primary circuit performs a second switching operation and a secondary circuit performs a first switching operation, according to an example embodiment.

Also, FIG. 10 may be also interpreted as an equivalent circuit of the transformer 10 or a control logic 130, which operates in a fourth mode. FIG. 10 will be described with reference to the reference numerals of FIGS. 1, 2B, and 4.

In the transformer 10 according to the example embodiment, some or all of a plurality of primary windings (e.g., LP1 and LP2) may be connected in parallel, and some or all of a plurality of secondary windings (e.g., LS1, LS2, LS3, and LS4) may be connected in series. As a result, an equivalent inductance of the primary windings LP1 and LP2 may be reduced, and an equivalent inductance of the secondary windings LS1, LS2, LS3, and LS4 may increase. For instance, the number of windings of a primary circuit 110 may be reduced, and the number of windings of a secondary circuit 120 may increase. For example, when a winding ratio of the primary circuit 110 to the secondary circuit 120 increases to, for example, 1:4 or 1:8, the transformer 10 or an electronic device 1 may have a high gain, and a noise factor may be improved. In addition, when the electronic device 1 operates as a transmitter, a power amplifier 500b having a low gain may be connected to a first I/O terminal ST. An impedance suitable or optimized for the power amplifier 500b may be implemented as a low input impedance.

Figure 11:
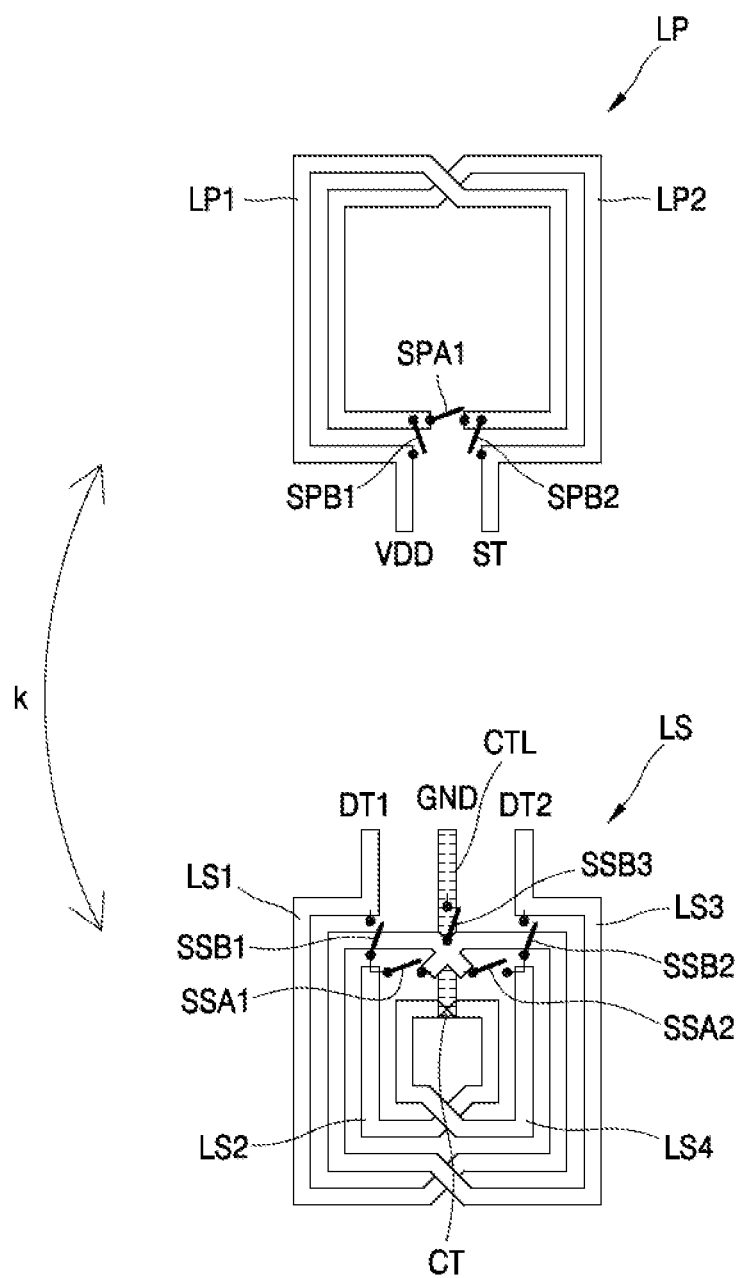
FIG. 11 is a diagram for explaining structures of a primary winding and a secondary winding according to an example embodiment.

FIG. 11 is a diagram for explaining structures of a primary winding LP and a secondary winding LS according to an example embodiment.

Referring to FIG. 11, the primary winding LP may include a first primary winding LP1 and a second primary winding LP2. Respective windings may not be electrically connected at a point where the first primary winding LP1 crosses the second primary winding LP2. For example, at the point where the first primary winding LP1 crosses the second primary winding LP2, a conducting wire of the first primary winding LP1 may be formed in a first layer, and a conducting wire of the second primary winding LP2 may be formed in a second layer that is different from the first layer. Unless otherwise specified below, windings are not electrically connected at a point where windings cross each other.

According to an example embodiment, the secondary winding LS may include a first secondary winding LS1, a second secondary winding LS2, a third secondary winding LS3, and a fourth secondary winding LS4. Similarly, windings are not electrically connected at a point where windings cross each other. However, a ground terminal GND, the second secondary winding LS2, and the fourth secondary winding LS4 may be electrically connected by a center tap line CTL. The center tap line CTL may be a conducting wire formed from a center tab node (e.g., CT in FIG. 10).

According to an example embodiment, the primary winding LP may further include a plurality of primary switches (e.g., SPA1, SPB1, and SPB2), and the secondary winding LS may further include a plurality of secondary switches (e.g., SSA1, SSA2, SSB1, SSB2, and SSB3). The primary winding LP and the secondary winding LS may adjust a coupling efficient k due to various switching operations. For instance, when only a first primary switch SPA1 is turned on and the remaining primary switches are turned off in the primary winding LP, the number of turns of the primary winding LP may be two. In an opposite switching operation, the number of turns of the primary winding LP may be one. Simultaneously, the first primary winding LP1 and the second primary winding LP2 may be connected in parallel when viewed from the first I/O terminal ST and the supply terminal VDD. Thus, the coupling coefficient k may be adjusted by adjusting the number of turns of the primary winding LP or the secondary winding LS depending on the switching operation.

Figure 12A:
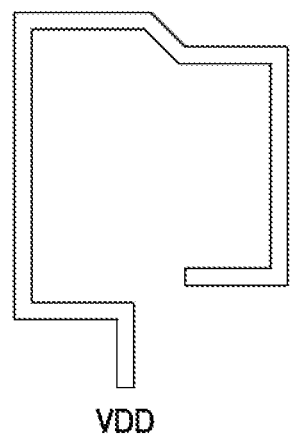
FIG. 12A is a diagram for explaining a structure of a first primary winding according to an example embodiment.
Figure 12B:
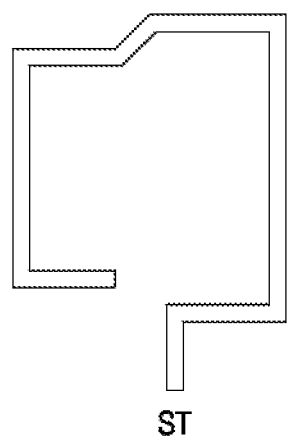
FIG. 12B is a diagram for explaining a structure of a second primary winding according to an example embodiment.
Figure 12C:
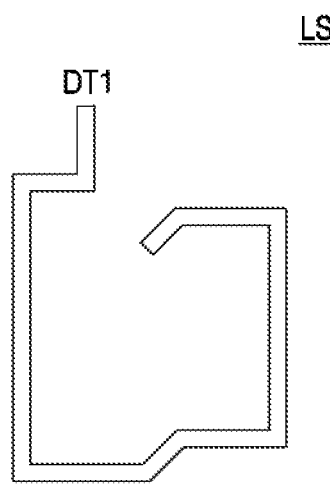
FIG. 12C is a diagram for explaining a structure of a first secondary winding according to an example embodiment.
Figure 12D:
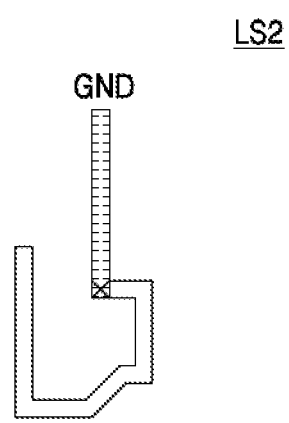
FIG. 12D is a diagram for explaining a structure of a second secondary winding according to an example embodiment.

FIG. 12A is a diagram for explaining a structure of a first primary winding according to an example embodiment. FIG. 12B is a diagram for explaining a structure of a second primary winding according to an example embodiment. FIG. 12C is a diagram for explaining a structure of a first secondary winding according to an example embodiment. FIG. 12D is a diagram for explaining a structure of a second secondary winding according to an example embodiment.

Figure 12E:
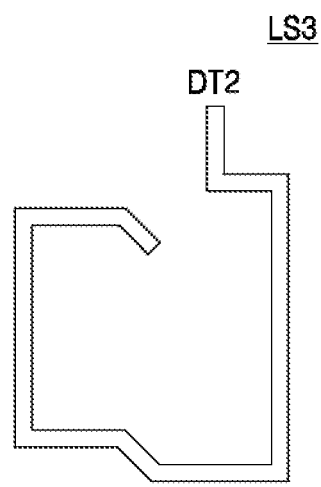
FIG. 12E is a diagram for explaining a structure of a third secondary winding according to an example embodiment.
Figure 12F:
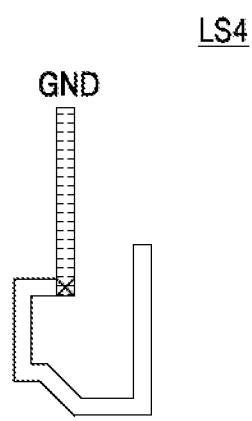
FIG. 12F is a diagram for explaining a structure of a fourth secondary winding according to an example embodiment.

FIG. 12E is a diagram for explaining a structure of a third secondary winding according to an example embodiment. FIG. 12F is a diagram for explaining a structure of a fourth secondary winding according to an example embodiment.

Referring to FIGS. 11 and 12A to 12F, a plurality of windings included in a primary winding LP and a secondary winding LS may not be electrically connected at points where the plurality of windings cross each other. That is, at the crossing points, some windings may be formed in a first layer, and other windings may be formed in a second layer. In other words, at the crossing points, the some windings and the other windings may be formed at layers located at different levels. The primary winding LP and the secondary winding LS may be formed in the same layer or adjacent layers at points where windings do not cross each other. By forming the primary winding LP and the secondary winding LS in the same layer or the adjacent layers, an induced magnetic flux may be reduced.

Referring to FIGS. 11, 12A, and 12B, a conducting wire (or trace) of a portion of a first primary winding LP1 may be formed outside the primary winding LP. For example, the conducting wire of the portion of the first primary winding LP1 may be formed farthest from the center of the primary winding LP. A conducting wire/trace of the remaining portion of the first primary winding LP1 may be formed inside the primary winding LP. For example, the conducting wire of the remaining portion of the first primary winding LP1 may be formed closest from the center of the primary winding LP. A second primary winding LP2 may be similar to the first primary winding LP1. For example, a conducting wire of a portion of the second primary winding LP2 may be formed outside the primary winding LP, and a conducting wire of the remaining portion thereof may be formed inside the primary winding LP. Meanwhile, one end of the first primary winding LP1 may be connected to a supply terminal VDD, and another end thereof may be connected to a first primary switch SPA1 and a third primary switch SPB2. One end of the second primary winding LP2 may be connected to a first I/O terminal ST, and another end thereof may be connected to the first primary switch SPA1 and a second primary switch SPB1.

Referring to FIGS. 11, 12C, 12D, 12E, and 12F, the plurality of windings included in the secondary winding LS may be formed at positions respectively different average distances from the center of the secondary winding LS. For example, a first position may be located a farthest average distance from the center of the secondary winding LS, and a fourth position may be located a closest average distance from the center of the secondary winding LS. A second position may be located an average distance from the center of the secondary winding LS, which is closer than the first position and farther than the third position. A third position may be located an average distance from the center of the secondary winding LS, which is closer than the second position and farther than the fourth position.

According to an example embodiment, portions of a first secondary winding LS1 and a third secondary winding LS3 may be formed at the first position, other portions thereof may be formed at the second position. Portions of a second secondary winding LS2 and a fourth secondary winding LS4 may be formed at the third position, and other portions thereof may be formed at the fourth position. The first to fourth positions may be positions on substantially the same plane. For instance, the first to fourth positions may be the same on a Z-axis and different on an X-axis and a Y-axis.

According to an example embodiment, the first secondary winding LS1 may be connected to a first differential terminal DT1, a first secondary switch S SA1, a second secondary switch SSA2, a third secondary switch SSB1, a fifth secondary switch SSB3, and a third secondary winding LS3. The second secondary winding LS2 may be connected to the first secondary switch S SA1, the third secondary switch SSB1, and a center tab node CT (or a ground terminal GND). The third secondary winding LS3 may be connected to a second differential terminal DT2, the second secondary switch SSA2, a fourth secondary switch SSB2, the fifth secondary switch SSB3, and the first secondary winding LS1. The fourth secondary winding LS4 may be connected to the second secondary switch SSA2, the fourth secondary switch SSB2, and the center tab node CT (or the ground terminal GND).

Figure 13:
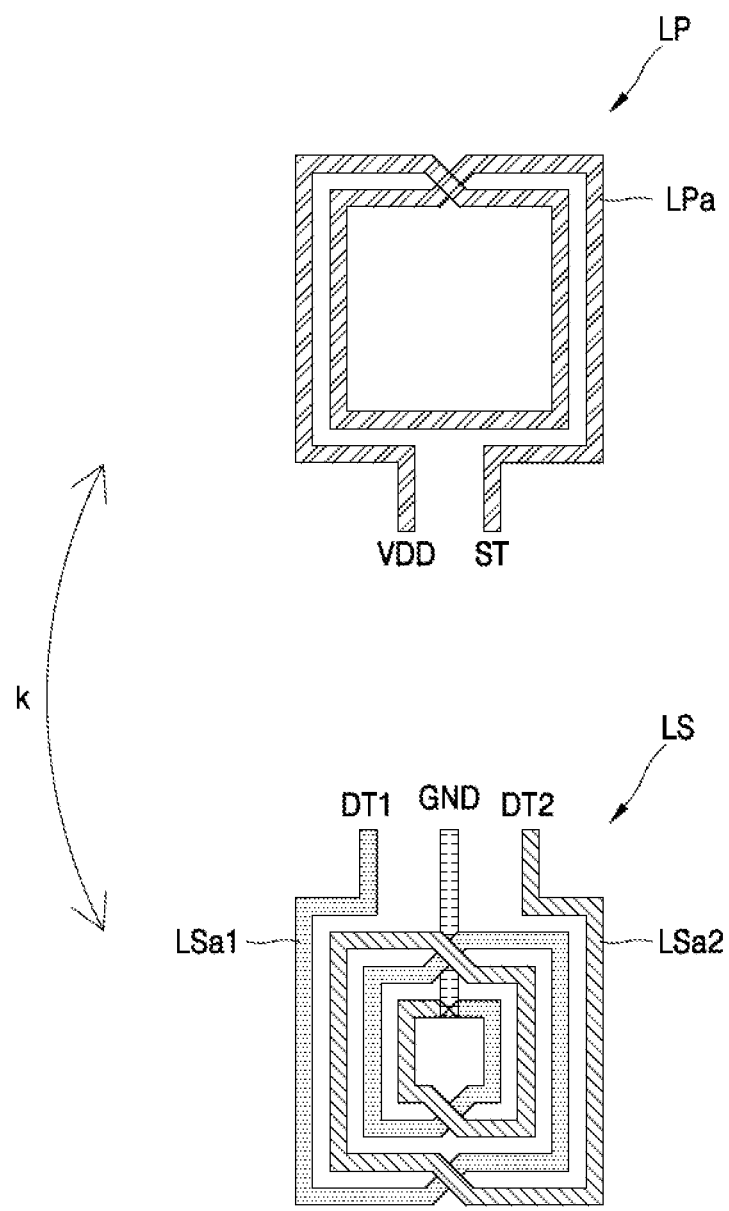
FIG. 13 is a diagram for explaining structures of a primary winding and a secondary winding configured to perform a first switching operation, according to an example embodiment.
Figure 14:
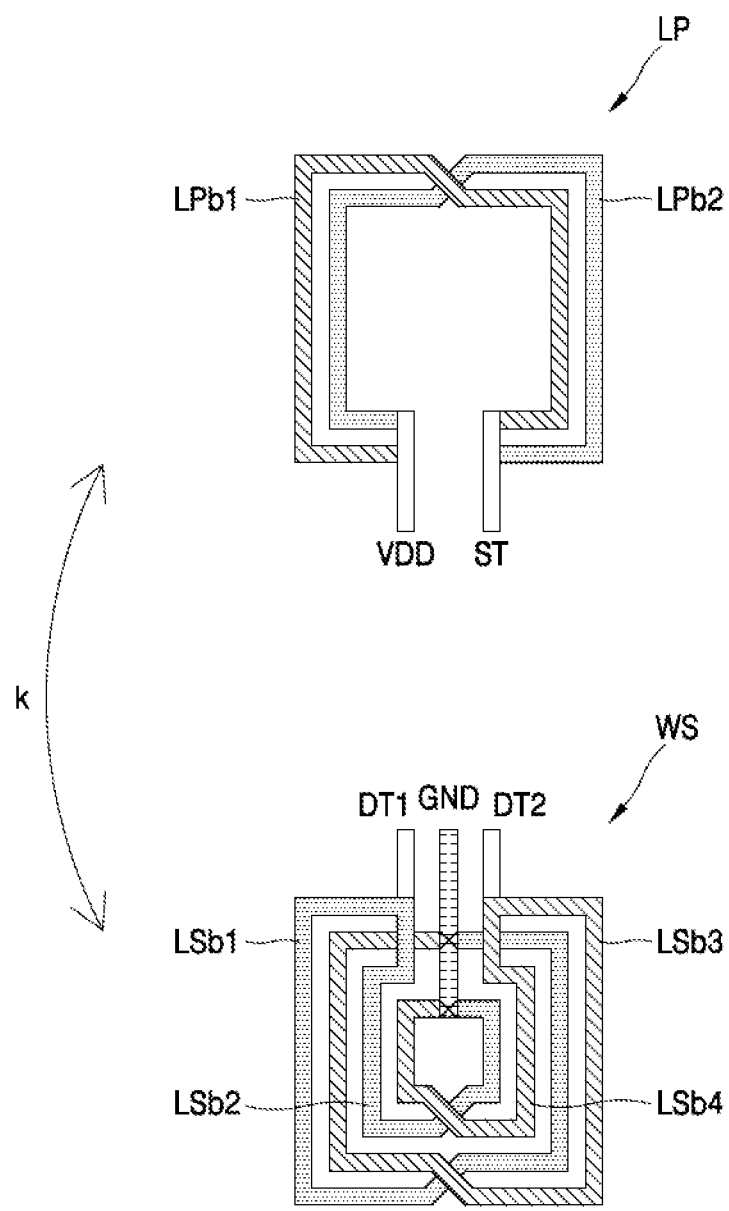
FIG. 14 is a diagram for explaining structures of a primary winding and a secondary winding configured to perform a second switching operation, according to an example embodiment.

FIG. 13 is a diagram for explaining structures of a primary winding and a secondary winding configured to perform a first switching operation, according to an example embodiment. FIG. 14 is a diagram for explaining structures of a primary winding and a secondary winding configured to perform a second switching operation, according to an example embodiment. Hereinafter, FIGS. 13 and 14 will be described with reference to the reference numerals of FIGS. 1 and 4.

Referring to FIGS. 13 and 14, a winding filled with the same hatching may refer to a winding to which the same signal, current, or voltage is applied. That is, windings filled with different hatchings may refer to windings that are not connected to each other. For example, a stripped winding and a dotted winding may not be connected to each other. Meanwhile, as described above with reference to FIG. 11, in a primary winding LP, windings may not be electrically connected at a position where the windings cross each other.

Referring to FIG. 13, primary switching circuitry SW1 and a secondary switching circuitry SW2 may perform the first switching operation. In a primary circuit 110, a first primary switch SPA1 may be turned on, and a second primary switch SPB1 and a third primary switch SPB2 may be turned off. Thus, a first primary winding LP1 and a second primary winding LP2 may be connected in series to each other. Referring to FIG. 13, a serial winding LPa may be a winding in which the first primary winding LP1 is connected in series to the second primary winding LP2. Thus, inductances of the first primary winding LP1 and the second primary winding LP2 may be summed to increase an equivalent inductance thereof.

Meanwhile, in a secondary circuit 120, a first secondary switch SSA1 and a second secondary switch SSA2 may be turned on, and a third secondary switch SSB1, a fourth secondary switch SSB2, and a fifth secondary switch SSB3 may be turned off. Thus, a first secondary winding LS1 and a second secondary winding LS2 may be connected in series, and a third secondary winding LS3 and a fourth secondary winding LS4 may be connected in series. As shown in FIG. 13, a serial winding LSa1 may be a winding in which the first secondary winding LS1 is connected in series to the second secondary winding LS2. Also, a serial winding LSa2 may be a winding in which a third secondary winding LS3 is connected in series to a fourth secondary winding LS4. Thus, inductances of the first secondary winding LS1 and the second secondary winding LS2 may be summed, and inductances of the third secondary winding LS3 and the fourth secondary winding LS4 may be summed. Accordingly, an equivalent inductance of the secondary circuit 120 may increase.

Referring to FIG. 14, the primary switching circuitry SW1 and the secondary switching circuitry SW2 may perform the second switching operation. In the second switching operation, the primary switching circuitry SW1 and the secondary switching circuitry SW2 may be in a switching state opposite to that of the above-described first switching operation. In the primary circuit 110, the first primary switch SPA1 may be turned off, and the second primary switch SPB1 and the third primary switch SPB2 may be turned on. Thus, a first primary parallel winding LPb1 and a second primary parallel winding LPb2 may be connected in parallel to each other. Thus, a parallel operation may be performed on inductances of the first primary parallel winding LPb1 and the second primary parallel winding LPb2 to increase an equivalent inductance thereof.

Meanwhile, in the secondary circuit 120, the first secondary switch SSA1 and the second secondary switch SSA2 may be turned off, and the third secondary switch SSB1, the fourth secondary switch SSB2, and the fifth secondary switch SSB3 may be turned on. Thus, the first secondary parallel winding LSb1 and the second secondary parallel winding LSb2 may be connected in parallel, and the third secondary parallel winding LSb3 and the fourth secondary parallel winding LSb4 may be connected in parallel.

The above-described first primary serial winding LPb1 and second primary serial winding LPb2 may be substantially the same as the first primary winding LP1 and the second primary winding LP2, respectively. Also, the first secondary parallel winding LSb1 to the fourth secondary parallel winding LSb4 may be substantially the same as the first secondary winding LS1 to the fourth secondary winding LS4, respectively.

Referring to FIGS. 13 and 14, while an input signal is being received through a first I/O terminal ST or a second I/O terminal DT1 and DT2, a plurality of primary windings (e.g., LP1 and LP2) and a plurality of secondary windings (e.g., LS1, LS2, LS3, and LS4) may not be floating. In a typical switching transformer, a floating conductive wire through which current does not flow may be generated in some switching operations. That is, when the floating conducting wire is generated, an insignificant conducting wire may be designed in the some switching operations and thus, a chip size may be increased, and costs may increase. In addition, when the floating conducting wire is present, a magnetic flux generated by a conducting wire in which current flows may be blocked or impeded by the floating conducting wire, thereby causing the loss of the magnetic flux. However, according to the example embodiments, since a floating conducting wire is not generated, a chip size may be optimized, costs may be reduced, and the loss of the magnetic flux may be reduced to increase a coupling coefficient. Thus, the performance of the transformer 10 may be improved.

Figure 15:
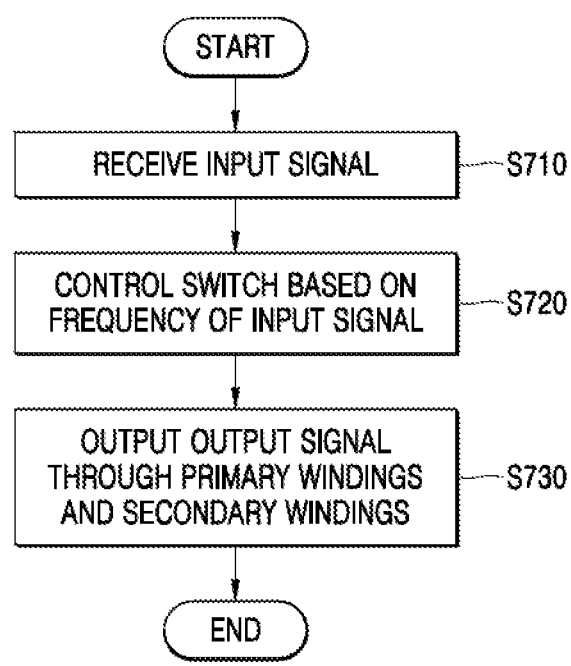
FIG. 15 is a flowchart of an operating method of a transformer according to an example embodiment.

FIG. 15 is a flowchart of an operating method of a transformer according to an example embodiment. FIG. 15 will be described with reference to the reference numerals of the above-described drawings.

In the method of FIG. 15, an input signal may be received through a first I/O terminal ST or a second I/O terminal DT1 and DT2 (S710).

At least one primary switch connected between a plurality of primary windings (e.g., LP1 and LP2) and at least one secondary switch connected between a plurality of secondary windings (e.g., LS1, LS2, LS3, and LS4) may be controlled based on a frequency of the input signal (S720).

In an example, when the frequency of the input signal is less than a reference frequency, the primary windings LP1 and LP2 may be connected in series, and the secondary windings LS1, LS2, LS3, and LS4 may be connected in series. Thus, an equivalent inductance of the primary windings LP1 and LP2 may increase, and an equivalent inductance of the secondary windings LS1, LS2, LS3, and LS4 may increase.

In another example, when the frequency of the input signal is greater than or equal to the reference frequency, the primary windings LP1 and LP2 may be connected in parallel, and the secondary windings LS1, LS2, LS3, and LS4 may be connected in parallel. Thus, the equivalent inductance of the primary windings LP1 and LP2 may be reduced, and the equivalent inductance of the secondary windings LS1, LS2, LS3, and LS4 may be reduced.

An output signal may be output through the primary windings LP1 and LP2 and the secondary windings LS1, LS2, LS3, and LS4 (S730). The output signal may be a signal obtained by increasing or reducing a voltage and current of the input signal. That is, the output signal may be a signal obtained by transforming the input signal. When an electronic device 1 is a transmitter 3, the output signal may be output through the first I/O terminal ST1. When the electronic device 1 is a receiver 2, the output signal may be output through the second I/O terminal DT1 and DT2.

Figure 16:
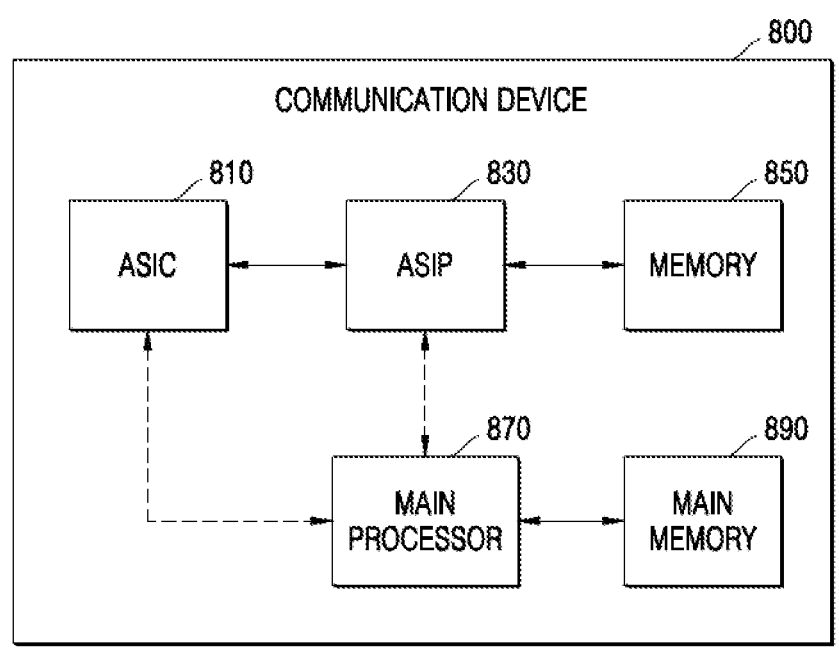
FIG. 16 is a block diagram of a communication device according to an example embodiment.

FIG. 16 is a block diagram of a communication device 800 according to an example embodiment. The communication device 800 may include an application specific integrated circuit (ASIC) 810, an application specific instruction set processor (ASIP) 830, a memory 850, a main processor 870, and a main memory 890. At least two of the ASIC 810, the ASIP 830, and the main processor 870 may communicate with each other. Also, at least two of the ASIC 810, the ASIP 830, the memory 850, the main processor 870, and the main memory 890 may be embedded in a single chip.

The ASIP 830, which is a customized IC for specific purposes, may support a dedicated instruction set for a specific application and execute instructions included in the instruction set. The memory 850 may communicate with the ASIP 830 and serve as a non-transitory storage device to store a plurality of instructions executed by the ASIP 830. For example, the memory 850 may include, but is not limited thereto, an arbitrary type of memory accessible by the ASIP 830, for example, random access memory (RAM), read-only memory (ROM), a tape, a magnetic disc, an optical disc, a volatile memory, a non-volatile memory, and a combination thereof.

The main processor 870 may execute a plurality of instructions and control the communication device 800. For example, the main processor 870 may control the ASIC 810 and the ASIP 830, process data received through a wireless communication network, or process a user's input for the communication device 800. The main memory 890 may communicate with the main processor 870 and serve as a non-transitory storage device to store the plurality of instructions executed by the main processor 870. For example, the main memory 890 may include, but is not limited thereto, an arbitrary type of memory accessible by the main processor 970, for example, RAM, ROM, a tape, a magnetic disc, an optical disc, a volatile memory, a non-volatile memory, and a combination thereof.

An electronic device 1 and/or a transformer 10 may be included in all or some configurations of the communication device 900 of FIG. 17. For example, the electronic device 1 and/or the transformer 10 may be included in a configuration that requires an output signal obtained by transforming an input signal. Also, the electronic device 1 and/or the transformer 10 may be included in a component that requires a transformer ratio that is controlled according to a frequency of the input signal. Meanwhile, an operating method of the transformer 10 may be performed by at least one of components included in the communication device 900 of FIG. 17. In some embodiments, an operation of the control logic 130 of FIG. 1 may be implemented as a plurality of instructions stored in the memory 850. The ASIP 830 may execute the plurality of instructions stored in the memory 850 and perform at least one of operations of the operating method of the transformer 10. In some embodiments, at least one of the operations of the operating method of the transformer 10 may be performed by a hardware block that is designed due to logical synthesis, and the hardware block may be included in the ASIC 810. In some embodiments, at least one of the operations of the operating method of the transformer 10 may be implemented as a plurality of instructions stored in the main memory 890. The main processor 870 may execute the plurality of instructions stored in the main memory 890 and perform at least one of the operations of the operating method of the transformer 10.

According to an example embodiment, in a high-frequency band, primary windings may be connected in parallel, and secondary windings may also be connected in parallel. Inductances may be reduced due to the windings connected in parallel and thus, the windings may be designed to have long lengths and/or large areas. Thus, a coupling coefficient, which is proportional to a length/area, and a coverable bandwidth may be increased.

According to an example embodiment, when an input signal is input, there is no floating winding, flux loss may be reduced. Thus, the coupling coefficient may be increased.

Meanwhile, structures or figures illustrated in the above-described drawings and the descriptions thereof are examples and may be extended and interpreted as other structures or figures that can be easily extended by one skilled in the art. That is, examples of a winding structure, the number of turns, a turn ratio, an inductance, and an impedance are provided for brevity and extended to various values according to design specifications.

While the inventive concept has been particularly shown and described with reference to embodiments thereof, it will be understood that various changes in form and details may be made therein without departing from the spirit and scope of the following claims.

What is claimed is:
1. A switching transformer comprising:
a primary circuit comprising a first input/output (I/O) terminal, which is a single ended terminal, a plurality of primary windings, and primary switching circuitry comprising a plurality of switches configured to selectively connect the plurality of primary windings in series between a supply voltage terminal and the single ended terminal, and to selectively connect the plurality of primary windings in parallel between the supply voltage terminal and the single ended terminal; and
a secondary circuit comprising first and second differential I/O terminals, first, second, third and fourth secondary windings, and secondary switching circuitry comprising a plurality of switches configured to selectively connect the first and second secondary windings in series between the first differential I/O terminal and a center tab node, selectively connect the first and second secondary windings in parallel between the first differential I/O terminal and the center tab node, selectively connect the third and fourth secondary windings in series between the second differential I/O terminal and the center tab node, and selectively connect the third and fourth secondary windings in parallel between the second differential terminal and the center tab node, wherein each of the primary switching circuitry and the secondary switching circuitry performs a switching operation based on a frequency band of an input signal received from the first I/O terminal.

2. The switching transformer of claim 1, wherein, when a frequency of the input signal is less than a reference frequency, each of the primary switching circuitry and the secondary switching circuitry performs a first switching operation, and when the frequency of the input signal is greater than or equal to the reference frequency, each of the primary switching circuitry and the secondary switching circuitry performs a second switching operation.

3. The switching transformer of claim 2, wherein, in the first switching operation, the plurality of primary windings are connected in series, the first and second secondary windings are connected in series between the first differential I/O terminal and the center tab node, and the third and fourth secondary windings are connected in series between the second differential I/O terminal and the center tab node.

4. The switching transformer of claim 2, wherein, in the second switching operation, the plurality of primary windings are connected in parallel, the first and second secondary windings are connected in parallel, and the third and fourth secondary windings are connected in parallel.

5. The switching transformer of claim 1, wherein, while the input signal is being received through the first I/O terminal, the plurality of primary windings and the first through fourth secondary windings are not floating.

6. The switching transformer of claim 1, wherein the first I/O terminal receives a signal output by a low-noise amplifier, and the first and second differential I/O terminals output a transformed signal to a frequency mixer.

7. The switching transformer of claim 1, wherein each of the primary switching circuitry and the secondary switching circuitry operates in response to a switching control signal that is based on a frequency of the input signal.

8. The switching transformer of claim 1, wherein the plurality of primary windings comprise a first primary winding and a second primary winding,
wherein the primary switching circuitry is configured to selectively connect the first primary winding and the second primary winding in series and in parallel.

9. The switching transformer of claim 8, wherein:
the secondary switching circuitry comprises a first secondary switch, a second secondary switch, a third secondary switch, a fourth secondary switch, and a fifth secondary switch;
the first secondary switch is provided between a first end of the first secondary winding and a first end of the second secondary winding, the second secondary switch is provided between a first end of the third secondary winding and a first end of the fourth secondary winding, the third secondary switch is provided between the first differential I/O terminal and the first end of the second secondary winding, the fourth secondary switch is provided between the first end of the fourth secondary winding and the second differential I/O terminal, and the fifth secondary switch is provided between the first end of the third secondary winding, and ground terminal connected to the center tab node;
each of a second end of the first secondary winding and a second end of the fourth secondary winding is connected to a center tab node, which is connected to a ground terminal;
the first end of the second secondary winding is selectively connected to the first differential I/O terminal through the third secondary switch;

the first end of the fourth secondary winding is selectively connected to the second differential I/O terminal through the fourth secondary switch;
the first end of the third secondary winding is selectively connected to the ground terminal through the fifth switch;
a second end of the third secondary winding is connected to the second differential I/O terminal; and
the first end of the fourth secondary winding is selectively connected to the second differential I/O terminal.

10. The switching transformer of claim 1, further comprising a variable capacitor connected between the supply voltage terminal and the first I/O terminal.

11. An electronic device comprising:
a primary circuit comprising a first input/output (I/O) terminal, which is a single ended terminal, a plurality of primary windings, and primary switching circuitry comprising a plurality of switches configured to selectively connect the plurality of primary windings in series between a supply voltage terminal and the single ended terminal, and to selectively connect the plurality of primary windings in parallel between the supply voltage terminal and the single ended terminal;
a secondary circuit comprising first and second differential I/O terminals, first, second, third and fourth secondary windings, and secondary switching circuitry comprising a plurality of switches configured to selectively connect the first and second secondary windings in series between the first differential I/O terminal and a center tab node, selectively connect the first and second secondary windings in parallel between the first differential I/O terminal and the center tab node, selectively connect the third and fourth secondary windings in series between the second differential I/O terminal and the center tab node, and selectively connect the third and fourth secondary windings in parallel between the second differential I/O terminal and the center tab node; and
control logic configured to output a switching control signal to the primary switching circuitry and the secondary switching circuitry to thereby activate one of a plurality of modes.

12. The electronic device of claim 11, wherein, in a first mode of the plurality of modes, the control logic is further configured to output a first switching control signal to the primary switching circuitry and the second switching circuitry to connect the plurality of primary windings in series, connect the first and second secondary windings in series between the first differential I/O terminal and the center tab node, and connect the third and fourth secondary windings in series between the second differential I/O terminal and the center tab node.

13. The electronic device of claim 12, wherein, in a second mode of the plurality of modes, the control logic is further configured to output a second switching control signal to the primary switching circuitry and the secondary switching circuitry,
wherein the second switching control signal indicates an inverted switching operation of a switching operation indicated by the first switching control signal.

14. The electronic device of claim 11, wherein, in a third mode of the plurality of modes, the control logic is further configured to output a third switching control signal to the primary switching circuitry and the secondary switching circuitry to connect the plurality of primary windings in series, connect the first and second secondary windings in parallel with one another, and connect the third and fourth secondary windings in parallel with one another.

15. The electronic device of claim 11, wherein, in a fourth mode of the plurality of modes, the control logic is further configured to output a fourth switching control signal to the primary switching circuitry and the secondary switching circuitry to connect the plurality of primary windings in parallel and connect the first and second secondary windings in series with one another, and connect the third and fourth secondary windings in series with one another.

* * * * *